United States Patent
Ahn et al.

(10) Patent No.: US 12,396,159 B2
(45) Date of Patent: Aug. 19, 2025

(54) SEMICONDUCTOR DEVICE AND METHODS OF MANUFACTURING THE SAME

(71) Applicant: Samsung Electronics Co., Ltd., Suwon-si (KR)

(72) Inventors: Junhyeok Ahn, Suwon-si (KR); Sohyun Park, Seoul (KR); Hyosub Kim, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 390 days.

(21) Appl. No.: 17/969,966

(22) Filed: Oct. 20, 2022

(65) Prior Publication Data

US 2023/0137846 A1  May 4, 2023

(30) Foreign Application Priority Data

Oct. 28, 2021 (KR) ................. 10-2021-0146063

(51) Int. Cl.
*H10B 12/00* (2023.01)
(52) U.S. Cl.
CPC ........... *H10B 12/315* (2023.02); *H10B 12/50* (2023.02)
(58) Field of Classification Search
None
See application file for complete search history.

(56) References Cited

U.S. PATENT DOCUMENTS

| | | | |
|---|---|---|---|
| 8,279,683 B2 | 10/2012 | Klein | |
| 8,383,479 B2 | 2/2013 | Purayath et al. | |
| 8,629,494 B2 | 1/2014 | Kim et al. | |
| 10,896,967 B2 | 1/2021 | Yoon et al. | |
| 2018/0350818 A1* | 12/2018 | Yoon | H10B 12/485 |
| 2020/0091305 A1* | 3/2020 | Yoon | H10D 30/0278 |
| 2022/0093610 A1* | 3/2022 | Kim | H01L 23/53228 |

FOREIGN PATENT DOCUMENTS

| | | | |
|---|---|---|---|
| KR | 10-2011-0098336 A | 9/2011 | |
| KR | 10-2011-0098386 A | 9/2011 | |
| KR | 10-2012-0003720 A | 1/2012 | |
| TW | 201117270 A | 5/2011 | |
| TW | I570847 B | 2/2017 | |
| TW | 202011517 A | 3/2020 | |

OTHER PUBLICATIONS

Taiwanese Office Action dated Aug. 29, 2023 issued in Taiwanese Patent Application No. 111140654.

* cited by examiner

*Primary Examiner* — Steven M Page
(74) *Attorney, Agent, or Firm* — Harness, Dickey & Pierce, P.L.C.

(57) ABSTRACT

Provided is a semiconductor device including a substrate including a cell array area and a peripheral circuit area and including a plurality of first active areas defined in the cell array area and at least one second active area defined in the peripheral circuit area; a plurality of bit lines arranged in the cell array area of the substrate and extending in a first direction; a plurality of cell pad structures arranged between the bit lines and each including a first conductive layer, a first intermediate layer, and a first metal layer that are sequentially arranged on a top surface of the first active area; and a peripheral circuit gate electrode disposed on the peripheral circuit area of the substrate and including a second conductive layer, a second intermediate layer, and a second metal layer sequentially arranged on the at least one second active area.

20 Claims, 23 Drawing Sheets

SEMICONDUCTOR DEVICE AND METHODS OF MANUFACTURING THE SAME

CROSS-REFERENCE TO RELATED APPLICATION

This application is based on and claims priority under 35 U.S.C. § 119 to Korean Patent Application No. 10-2021-0146063, filed on Oct. 28, 2021, in the Korean Intellectual Property Office, the disclosure of which is incorporated by reference herein in its entirety.

BACKGROUND

Inventive concepts relate to a semiconductor device and/or a method of manufacturing the same, and more particularly, to a semiconductor device including a cell capacitor and/or a method of manufacturing the same.

As semiconductor devices are being downscaled, sizes of individual micro circuit patterns for implementing semiconductor devices are being further reduced. Also, as the size of individual microcircuit patterns is reduced, the difficulty of a manufacturing process may increase due to a difference in pattern density between the interior of a cell array area and a peripheral area.

SUMMARY

Inventive concepts provide a semiconductor device capable of preventing or reducing the likelihood of and/or impact from process defects due to a step difference occurring at edge portions of a cell array area.

Alternatively or additionally, inventive concepts provide a method of manufacturing a semiconductor device capable of preventing or reducing the likelihood of and/or impact from process defects due to a step difference occurring at edge portions of a cell array area.

According to some example embodiments, there is provided a semiconductor device including a substrate including a cell array area and a peripheral circuit area. The semiconductor device includes a plurality of first active areas defined in the cell array area and at least one second active area defined in the peripheral circuit area; a plurality of bit lines in the cell array area of the substrate and extending in a first direction; a plurality of cell pad structures between the bit lines and each including a first conductive layer, a first intermediate layer, and a first metal layer that are sequentially arranged on a top surface of the first active area; and a peripheral circuit gate electrode on the peripheral circuit area of the substrate and including a second conductive layer, a second intermediate layer, and a second metal layer sequentially arranged on the at least one second active area.

According to some example embodiments, there is provided a semiconductor device including a substrate including a cell array area, a boundary area, and a peripheral circuit area and including a plurality of first active areas defined in the cell array area and at least one second active area defined in the peripheral circuit area; a plurality of bit lines in the cell array area of the substrate and extending in a first direction; a plurality of cell pad structures between two adjacent bit lines from among the plurality of bit lines and each including a first conductive layer and a first metal layer that are sequentially arranged on a top surface of the first active area; and a peripheral circuit gate electrode on the peripheral circuit area of the substrate and including a second conductive layer and a second metal layer sequentially arranged on the at least one second active area. A height of the cell pad structures is substantially the same as a height of the peripheral circuit gate electrode.

According to some example embodiments, there is provided a semiconductor device including a substrate including a cell array area, a boundary area, and a peripheral circuit area and including a plurality of first active areas defined in the cell array area and at least one second active area defined in the peripheral circuit area; a plurality of bit lines arranged in the cell array area of the substrate and extending in a first direction; a bit line contact between the bit lines and the first active areas and electrically connecting the bit lines to the first active areas; a bit line contact spacer surrounding sidewalls of the bit line contact; a plurality of cell pad structures between two adjacent bit lines from among the plurality of bit lines and each including a first conductive layer, a first intermediate layer, and a first metal layer that are sequentially arranged on a top surface of the first active area; a plurality of landing pads respectively arranged on the cell pad structures; and a peripheral circuit gate electrode on the peripheral circuit area of the substrate and including a second conductive layer, a second intermediate layer, and a second metal layer sequentially arranged on the at least one second active area. The second metal layer includes the same material as the material included in the first metal layer.

BRIEF DESCRIPTION OF THE DRAWINGS

Embodiments of inventive concepts will be more clearly understood from the following detailed description taken in conjunction with the accompanying drawings in which:

FIGS. 10A to 21 are cross-sectional views showing a method of manufacturing a semiconductor device according to some example embodiments, wherein, in detail, FIGS. 10A, 12 to 18, 19A, 20, and 21 are cross-sectional views corresponding to cross-sections taken along a line B1-B1' of FIG. 2, and FIGS. 10B, 11, and 19B are cross-sectional views corresponding to cross-sections taken along a line B2-B2' of FIG. 2.

DETAILED DESCRIPTION OF VARIOUS EXAMPLE EMBODIMENTS

Figure 1:
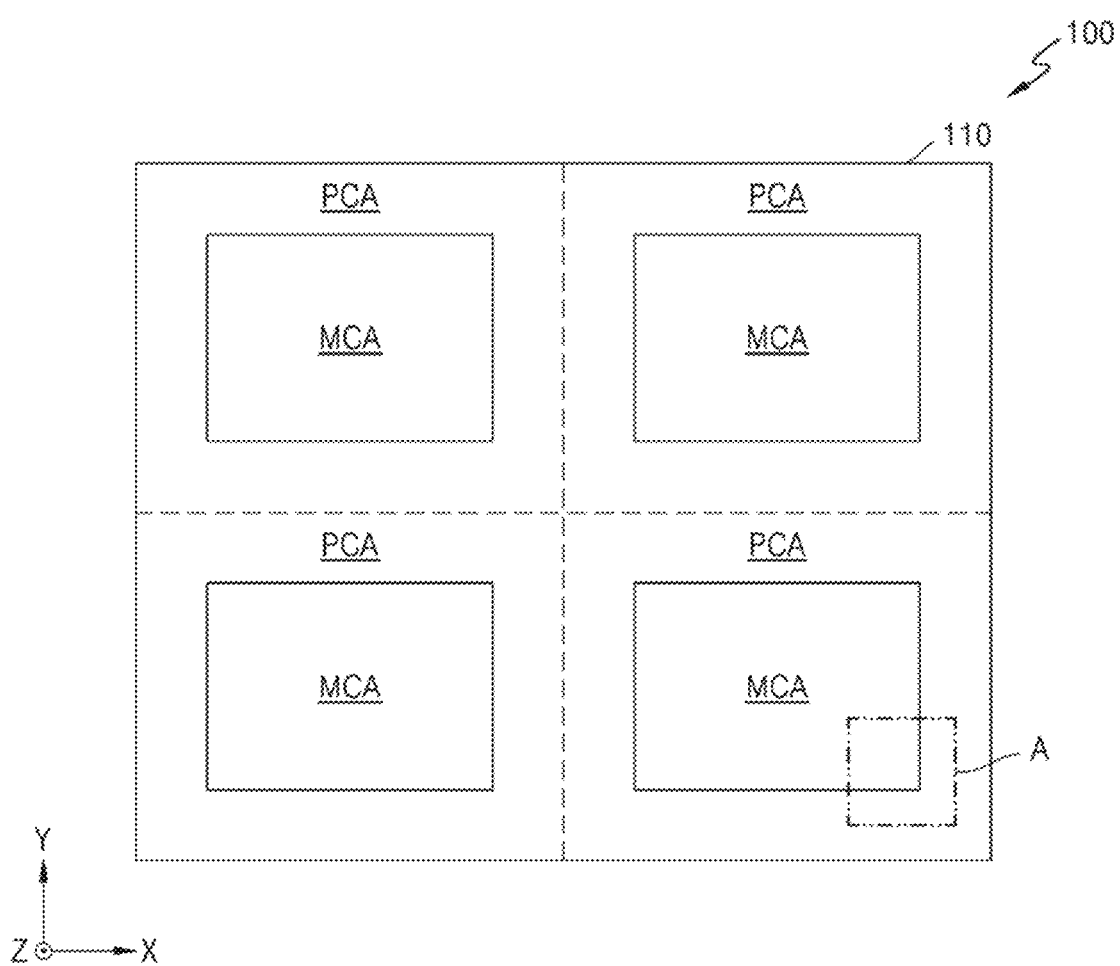
FIG. 1 is a layout diagram showing a semiconductor device according to some example embodiments.
Figure 2:
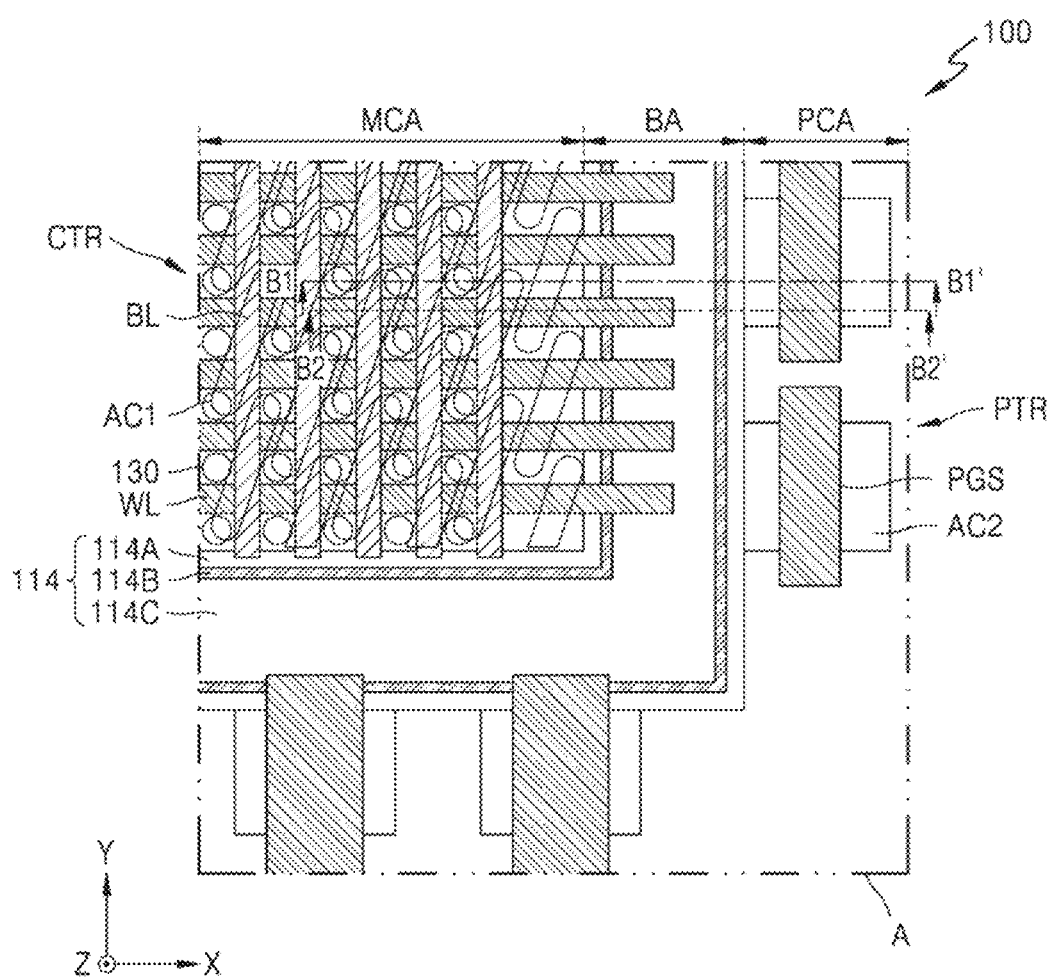
FIG. 2 is an enlarged layout view of a portion A of FIG. 1.
Figure 3:
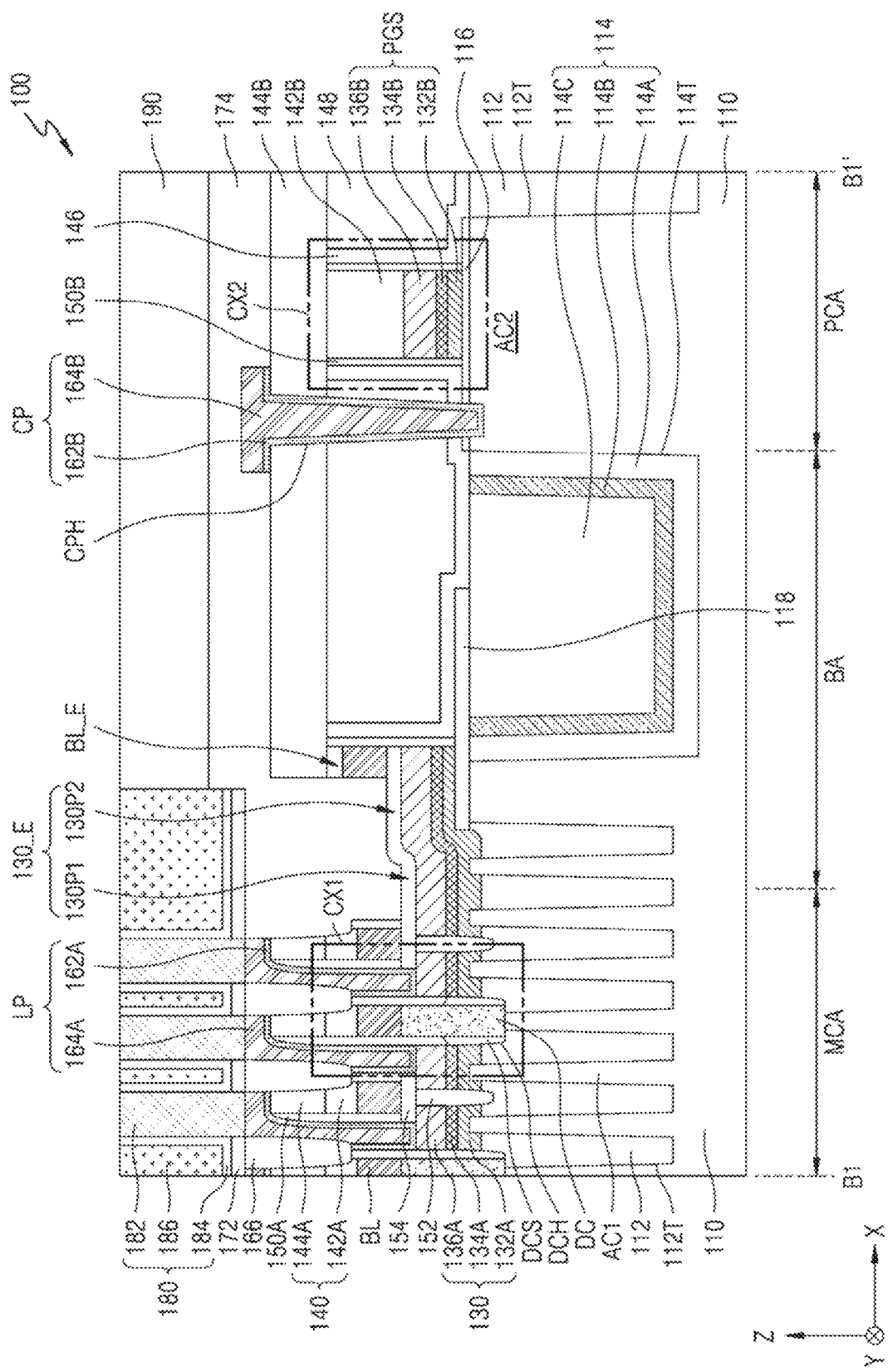
FIG. 3 is a cross-sectional view taken along a line B1-B1' of FIG. 2.

FIG. 1 is a layout diagram showing a semiconductor device 100 according to some example embodiments. FIG. 2 is an enlarged layout view of a portion A of FIG. 1. FIG. 3 is a cross-sectional view taken along a line B1-B1' of FIG.

Figure 4:
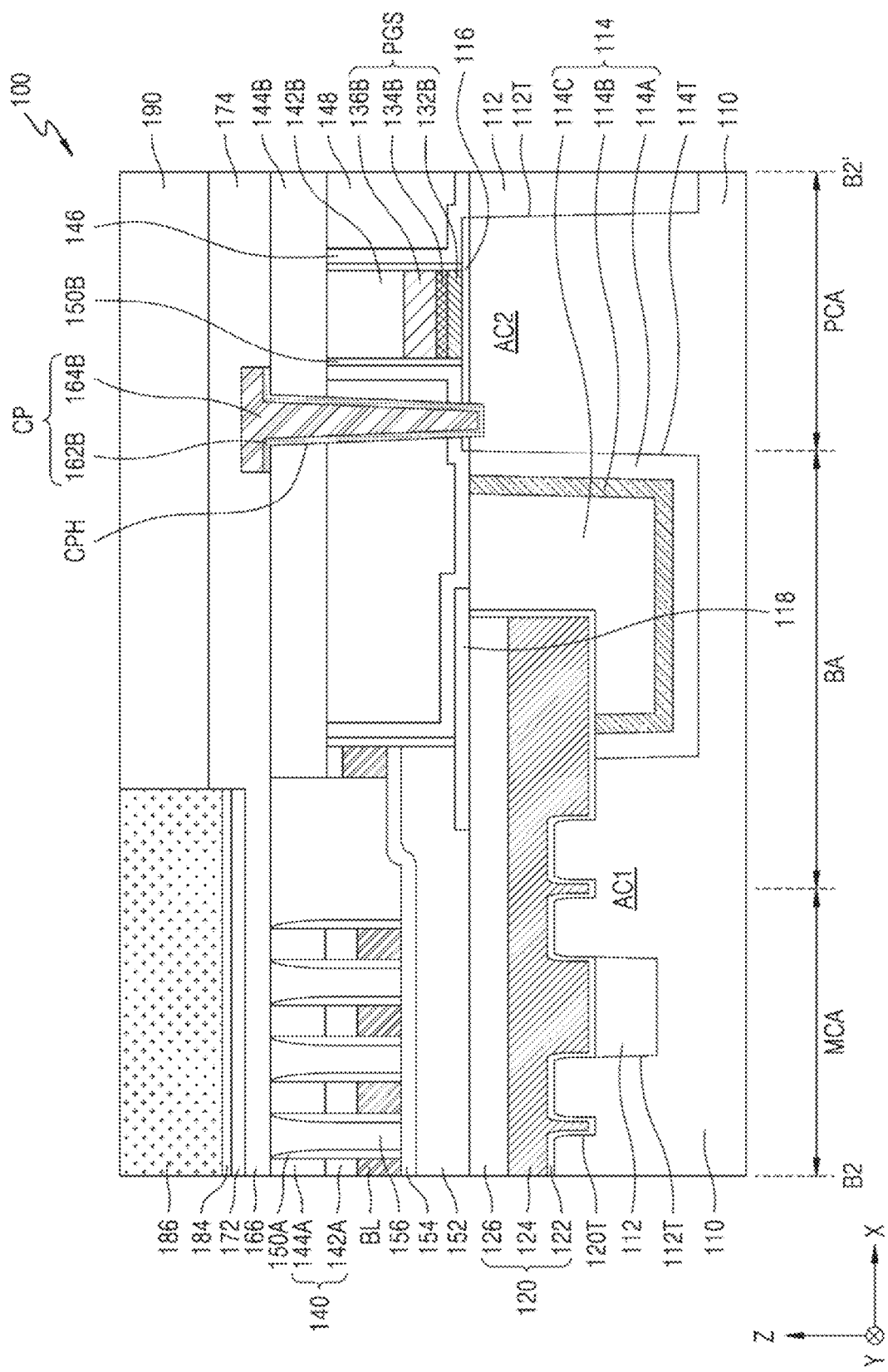
FIG. 4 is a cross-sectional view taken along a line B2-B2' of FIG. 2.
Figure 5:
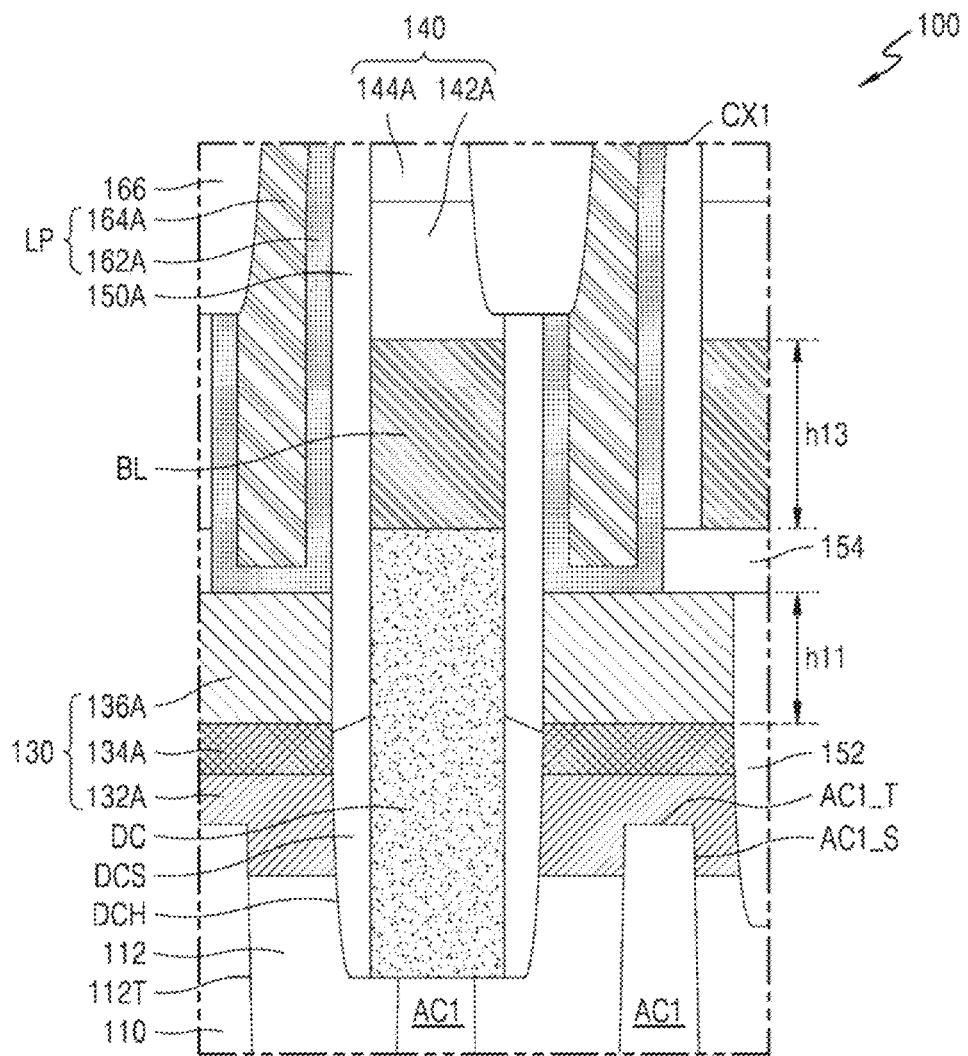
FIG. 5 is an enlarged cross-sectional view of a portion CX1 of FIG. 3.
Figure 6:
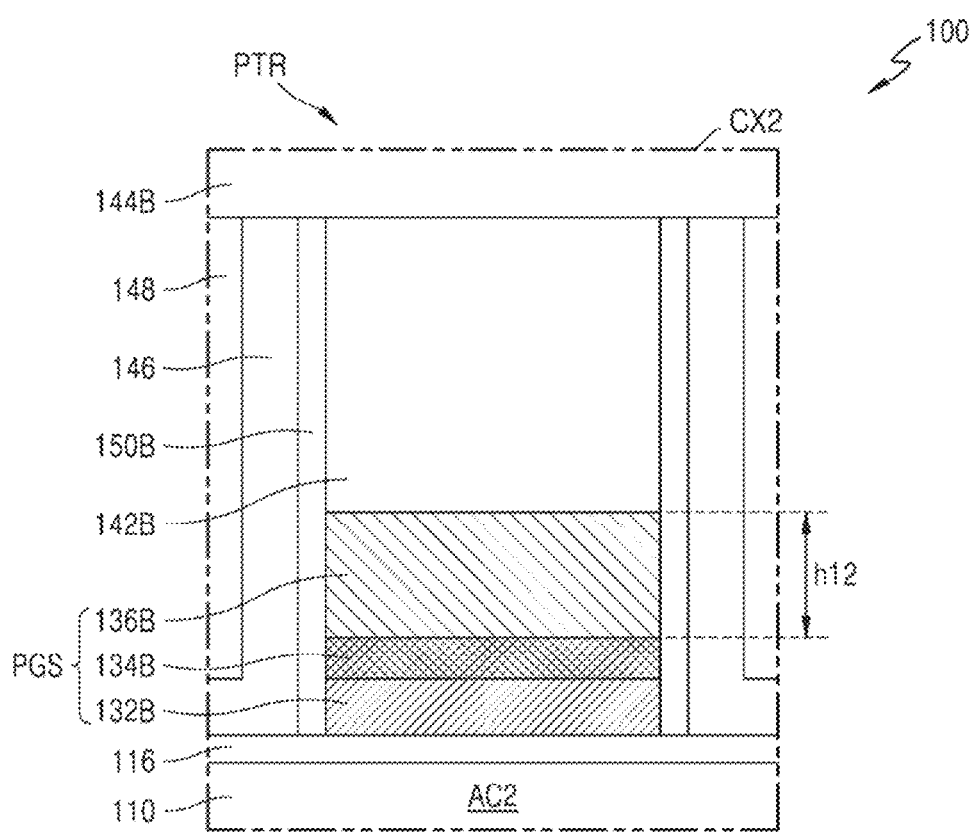
FIG. 6 is an enlarged cross-sectional view of a portion CX2 of FIG. 3.

2. FIG. 4 is a cross-sectional view taken along a line B2-B2' of FIG. 2. FIG. 5 is an enlarged cross-sectional view of a portion CX1 of FIG. 3. FIG. 6 is an enlarged cross-sectional view of a portion CX2 of FIG. 3.

Referring to FIGS. 1 to 6, the semiconductor device 100 may include a substrate 110 including a cell array area MCA and a peripheral circuit area PCA. The cell array area MCA may be or may include a memory cell area of a DRAM device, and the peripheral circuit area PCA may be or may include a core area or a peripheral circuit area of the DRAM device; however, example embodiments are not limited thereto. For example, the cell array area MCA may include a cell transistor CTR and a capacitor structure 180 connected thereto, and the peripheral circuit area PCA may include a peripheral circuit transistor PTR for transferring signals and/or power to the cell transistor CTR included in the cell array area MCA. In some example embodiments, the peripheral circuit transistor PTR may configure various circuits such as a command decoder, control logic, an address buffer, a row decoder, a column decoder, a sense amplifier, a redundancy circuit, and/or a data input/output circuit.

A device isolation trench 112T may be formed in the substrate 110, and a device isolation layer 112 may be formed in the device isolation trench 112T. The device isolation layer 112 may define a plurality of first active areas AC1 on the substrate 110 in the cell array area MCA and may define a plurality of second active areas AC2 on the substrate 110 in the peripheral circuit area PCA.

A boundary trench 114T may be formed in a boundary area BA between the cell array area MCA and the peripheral circuit area PCA, and a boundary structure 114 may be formed in the boundary trench 114T. When viewed from above (e.g. in plan view), the boundary trench 114T may be provided to surround all sides. e.g. four sides of the cell array area MCA. The boundary structure 114 may include a buried insulation layer 114A, an insulation liner 114B, and a gap-fill insulation layer 114C arranged inside the boundary trench 114T.

The buried insulation layer 114A may be conformally disposed on the inner wall of the boundary trench 114T. In some example embodiments, the buried insulation layer 114A may include silicon oxide. For example, the buried insulation layer 114A may include silicon oxide formed through one or more of an atomic layer deposition (ALD) process, a chemical vapor deposition (CVD) process, a plasma enhanced CVD (PECVD) process, a low pressure CVD (LPCVD) process, etc.

The insulation liner 114B may be conformally disposed on the inner wall of the boundary trench 114T on the buried insulation layer 114A. In some example embodiments, the insulation liner 114B may include silicon nitride. For example, the insulation liner 114B may include silicon nitride formed through one or more of an ALD process, a CVD process, a PECVD process, an LPCVD process, etc.

The gap-fill insulation layer 114C may fill the boundary trench 114T on the insulation liner 114B. In some example embodiments, the gap-fill insulation layer 114C may include one or more of a silicon oxide like Tonen Silazene (TOSZ), undoped silicate glass (USG), boro-phospho-silicate glass (BPSG), phosphosilicate glass (PSG), flowable oxide (FOX), plasma enhanced deposition of tetra-ethyl-orthosilicate (PE-TEOS), or fluoride silicate glass (FSG).

In the cell array area MCA, the first active areas AC1 may be arranged to have long axes in a diagonal direction with respect to a first horizontal direction X and a second horizontal direction Y. The diagonal direction may be a direction of between 10 degrees and 80 degrees with respect to the first horizontal direction X and the second horizontal direction Y, for example may be a direction 70 degrees with respect to the first horizontal direction X; however, example embodiments are not limited thereto. A plurality of word lines WL may extend parallel to one another along the first horizontal direction X across the first active areas AC1. A plurality of bit lines BL may extend parallel to one another along the second horizontal direction Y on the word lines WL. The bit lines BL may be connected to the first active areas AC1 via direct contacts DC.

A plurality of cell pad structures 130 may be formed between two bit lines BL adjacent to each other from among the bit lines BL. The cell pad structures 130 may be arranged in a row in the first horizontal direction X and the second horizontal direction Y. A plurality of landing pads LP may be formed on the cell pad structures 130. The cell pad structures 130 and the landing pads LP may connect lower electrodes 182 of the capacitor structure 180 formed over the bit lines BL to the first active areas AC1. The landing pads LP may be arranged to partially overlap the cell pad structures 130, respectively.

The substrate 110 may include silicon. e.g., monocrystalline silicon, polycrystalline silicon, or amorphous silicon. In some example embodiments, the substrate 110 may include at least one selected from among Ge, SiGe, SiC, GaAs, InAs, and InP. In some example embodiments, the substrate 110 may include a conductive region, e.g., a well doped with an impurity or a structure doped with an impurity. The device isolation layer 112 may include an oxide film, a nitride film, or a combination thereof.

In the cell array area MCA, a plurality of word line trenches 120T extending in a first direction (X direction) may be arranged on the substrate 110, and a buried gate structure 120 may be disposed in the word line trenches 120T. The buried gate structure 120 may include gate dielectric layers 122, gate electrodes 124, and capping insulation layers 126 respectively arranged in the word line trenches 120T. A plurality of gate electrodes 124 may correspond to the word lines WL shown in FIG. 1.

A plurality of gate dielectric layers 122 may include one or more of a silicon oxide film, a silicon nitride film, a silicon oxynitride film, an oxide/nitride/oxide (ONO) film, or a high-k dielectric film having a dielectric constant higher than that of the silicon oxide film. The gate electrodes 124 may include Ti, TiN, Ta, TaN, W, WN, TiSiN, WSiN, or a combination thereof. A plurality of capping insulation layers 126 may include a silicon oxide film, a silicon nitride film, a silicon oxynitride film, or a combination thereof.

The word line trenches 120T may extend from the cell array area MCA into the boundary area BA, and respective end portions of the word line trenches 120T may vertically overlap the boundary structure 114 in the boundary area BA.

A buffer layer 118 may be formed on the substrate 110, the buried gate structure 120, and the boundary structure 114 in the boundary area BA. The buffer layer 118 may include an oxide film, a nitride film, or a combination thereof.

A plurality of bit line contacts or direct contacts DC may be formed in a plurality of bit line contact holes or direct contact holes DCH on the substrate 110. The direct contacts DC may be connected to the first active area AC1. The direct contacts DC may include TiN, TiSiN. W, tungsten silicide, doped polysilicon, or a combination thereof.

A bit line contact spacer or direct contact spacer DCS may be disposed on the inner wall of the direct contact hole DCH. The direct contact spacer DCS may be disposed on the lower sidewall of the direct contact hole DCH and may cover the lower portion of the direct contact DC.

The bit lines BL may extend long in the second horizontal direction Y over the substrate 110 and the plurality of direct contacts DC. The bit lines BL may be connected to the first active areas AC1 via the direct contacts DC, respectively. The bit lines BL may include ruthenium (Ru), tungsten (W), cobalt (Co), titanium (Ti), titanium nitride (TiN), or a combination thereof.

The bit lines BL may be covered by a plurality of insulation capping structures 140, respectively. The insulation capping structures 140 may extend in the second horizontal direction Y on the bit lines BL. The insulation capping structures 140 may each include a lower capping pattern 142A and an upper capping pattern 144A.

Bit line spacers 150A may be arranged on both sidewalls of each of the bit lines BL. The bit line spacers 150A may extend in the second horizontal direction Y on both sidewalls of the bit lines BL, and portions of the bit line spacers 150A may extend into the direct contact holes DCN and cover the upper portion of the sidewall of the direct contacts DC. Although FIG. 3 shows that the bit line spacer 150A is a single material layer, in some example embodiments, the bit line spacer 150A may be formed as a stacked structure of a plurality of spacer layers (not shown), and at least one of the spacer layers may be an air spacer.

The cell pad structures 130 may be arranged between the bit lines BL. For example, one cell pad structure 130 may be disposed between two adjacent bit lines BL at a vertical level lower than that of the bit lines BL. For example, insulation patterns 152 may be disposed between the two cell pad structures 130 arranged in the first horizontal direction X and between two cell pad structures 130 arranged in the second horizontal direction Y, and the insulation pattern 152 may electrically separate two adjacent cell pad structures 130 from each other. Also, a lower portion of the sidewall of the cell pad structure 130 may contact the direct contact spacer DCS, and an upper portion of the sidewall of the cell pad structure 130 may contact the bit line spacer 150A.

In some example embodiments, the cell pad structures 130 may include a first conductive layer 132A, a first intermediate layer 134A, and a first metal layer 136A sequentially arranged on the first active area AC1. In some example embodiments, the first conductive layer 132A may include Si, Ge, W, WN, CO, Ni, Al, Mo, Ru, Ti, TiN, Ta, TaN, Cu, or a combination thereof. The first intermediate layer 134A and the first metal layer 136A may each include TiN, TiSiN, W, tungsten silicide, or a combination thereof.

As shown in FIG. 5, the bottom surface of the first conductive layer 132A may be disposed at a level lower than that of a top surface AC1_T of the first active area AC1, and the first conductive layer 132A may be disposed to cover the top surface AC1_T and a sidewall AC1_S of the first active area AC1. Therefore, a relatively large contact area may be secured between the first conductive layer 132A and the first active area AC1. In some example embodiments, unlike as shown in FIG. 5, the bottom surface of the first conductive layer 132A may be disposed at substantially the same level as the top surface AC1_T of the first active area AC1, and thus the bottom surface of the first conductive layer 132A may have a flat profile.

An insulation layer 154 may be disposed on the cell pad structure 130 to cover the cell pad structure 130 and the insulation pattern 152.

A plurality of insulation fences 156 may be arranged in the second horizontal direction Y between two adjacent bit lines BL. The insulation fences 156 may be arranged on the insulation layer 154 at positions to vertically overlap the word line trenches 120T.

The landing pads LP may be arranged on the cell pad structures 130. The landing pads LP may each include a conductive barrier film 162A and a landing pad conductive layer 164A. The conductive barrier film 162A may include Ti, TiN, or a combination thereof. The landing pad conductive layer 164A may include a metal, a metal nitride, a conductive polysilicon, or a combination thereof. For example, the landing pad conductive layer 164A may include W. The landing pads LP may have a pattern shape of a plurality of islands when viewed from above.

The landing pads LP may be electrically insulated from one another by an insulation pattern 166 surrounding the landing pads LP. The insulation pattern 166 may include at least one of silicon nitride, silicon oxide, and silicon oxynitride.

A first etch stop layer 172 may be disposed on the landing pads LP and the insulation pattern 166 in the cell array area MCA. The capacitor structure 180 may be disposed on the first etch stop layer 172. The capacitor structure 180 may include a plurality of lower electrodes 182, a capacitor dielectric layer 184, and an upper electrode 186.

The lower electrodes 182 may penetrate through the first etch stop layer 172 and extend in a vertical direction Z on the landing pads LP. The bottom portions of the lower electrodes 182 may penetrate through the first etch stop layer 172 and connected to the landing pads LP. The capacitor dielectric layer 184 may be disposed on the lower electrodes 182. The upper electrode 186 may be disposed on the capacitor dielectric layer 184 to cover the lower electrodes 182.

In some example embodiments, the capacitor dielectric layer 184 may include at least one of zirconium oxide, hafnium oxide, titanium oxide, niobium oxide, tantalum oxide, yttrium oxide, strontium titanium oxide, barium strontium titanium oxide, scandium oxide, and lanthanide oxide. The lower electrodes 182 and the upper electrode 186 may include at least one selected from among metals such as ruthenium (Ru), titanium (Ti), tantalum (Ta), niobium (Nb), iridium (Ir), molybdenum (Mo), and tungsten (W), conductive metal nitrides such as titanium nitride (TiN), tantalum nitride (TaN), niobium nitride (NbN), molybdenum nitride (MoN), and tungsten nitride (WN), and conductive metal oxides such as iridium oxide ($IrO_2$), ruthenium oxide ($RuO_2$), and strontium ruthenium oxide ($SrRuO_3$).

In some example embodiments, the lower electrodes 182 may each have a pillar shape extending in the vertical direction Z, and the lower electrodes 182 may each have a circular horizontal cross-section. However, the horizontal cross-sectional shape of the lower electrodes 182 is not limited thereto, and the lower electrodes 182 may have a horizontal cross-section of various polygonal shapes and rounded polygonal shapes such as an ellipse, a square, a rounded square, a rhombus, a trapezoid, etc. Alternatively or additionally, although FIG. 3 shows that the lower electrodes 182 have a pillar shape having circular horizontal cross-sections throughout the entire heights thereof, in some example embodiments, the lower electrodes 182 may have a cylindrical shape with a closed bottom.

The peripheral circuit transistor PTR may be disposed on the second active area AC2 in the peripheral circuit area PCA. The peripheral circuit transistor PTR may include a gate dielectric layer 116, a peripheral circuit gate electrode PGS, and a gate capping pattern 142B that are sequentially stacked on the second active area AC2.

The gate dielectric layer 116 may include at least one selected from among a silicon oxide film, a silicon nitride film, a silicon oxynitride film, an oxide/nitride/oxide (ONO) film, or a high-k dielectric film having a dielectric constant higher than that of the silicon oxide film. The gate capping pattern 142B may include a silicon nitride film.

The peripheral circuit gate electrode PGS may include a second conductive layer 132B, a second intermediate layer 134B, and a second metal layer 136B. In some example embodiments, the second conductive layer 132B may include Si, Ge, W, WN, Co, Ni, Al, Mo, Ru, Ti, TiN, Ta, TaN, Cu, or a combination thereof. The second intermediate layer 134B and the second metal layer 136B may each include TiN, TiSiN, W, tungsten silicide, or a combination thereof.

In some example embodiments, the materials constituting or included in the second conductive layer 132B, the second intermediate layer 134B, and the second metal layer 136B may be identical to the materials constituting or included in the first conductive layer 132A, the first intermediate layer 134A, and the first metal layer 136A included in the cell pad structure 130 in the cell array area MCA, respectively. For example, the peripheral circuit gate electrode PGS may be simultaneously formed during a process of forming the cell pad structure 130. In some example embodiments, because the cell pad structure 130 is formed at the same time as the peripheral circuit gate electrode PGS, the materials included in the second conductive layer 132B, the second intermediate layer 134B, and the second metal layer 136B may be exactly the same as the respective materials included in the first conductive layer 132A, the first intermediate layer 134A, and the first metal layer 136A included in the cell pad structure 130 in the cell array area MCA. In some example embodiments, the peripheral circuit gate electrode PGS is not formed at the same time as that of the bit line BL. Products and/or devices formed with such a process may have a different structure than products and/or devices formed with a typical process, insofar as the materials may be the same and/or the thickness may be the same.

As shown in FIGS. 5 and 6, the first metal layer 136A included in the cell pad structure 130 may have a first height h11 in the vertical direction Z, and the second metal layer 136B included in the peripheral circuit gate electrode PGS may have a second height h12 in the vertical direction Z. In some example embodiments, the second height h12 may be substantially the same as the first height h11. For example, the first metal layer 136A and the second metal layer 136B may be formed during the same process by using the same material, and thus the first height h11 of the first metal layer 136A may be equal to the second height h12 of the second metal layer 136B.

Alternatively or additionally, the bit line BL may have a third height h13 in the vertical direction Z, and the third height h13 may be different from the first height h11 and the second height h12. Alternatively or additionally, the material constituting the bit line BL may be different from the material constituting the second metal layer 136B. In some embodiments, the second metal layer 136B included in the peripheral circuit gate electrode PGS may include tungsten (W), the first metal layer 136A included in the cell pad structure 130 may include tungsten (W), and the bit line BL may include ruthenium (Ru). However, inventive concepts are not limited thereto.

The peripheral circuit gate electrode PGS and both sidewalls of the gate capping pattern 142B may be covered by insulation spacers 150B. The insulation spacers 150B may include an oxide layer, a nitride layer, or a combination thereof. The peripheral circuit transistor PTR and the insulation spacers 150B may be covered by a passivation layer 146, and a first interlayer insulation layer 148 may be disposed on the passivation layer 146 to fill the space between two adjacent peripheral circuit transistors PTR. A capping insulation layer 144B may be disposed on the first interlayer insulation layer 148 and the passivation layer 146.

A contact plug CP may be formed in a contact hole CPH vertically penetrating through the first interlayer insulation layer 148 and the capping insulation layer 1448 in the peripheral circuit area PCA. The contact plug CP may include a conductive barrier film 162B and a landing pad conductive layer 164B, similar to the landing pads LP formed in the cell array area MCA. A metal silicide layer (not shown) may be provided between the second active area AC2 and the contact plug CP.

A second etch stop layer 174 covering the contact plug CP may be disposed on the capping insulation layer 144B. A second interlayer insulation layer 190 covering the capacitor structure 180 may be disposed on the second etch stop layer 174.

As shown in FIG. 3, the outermost cell pad structure 130 from among the cell pad structures 130 may extend onto the boundary area BA. The cell pad structure 130 disposed on the boundary area BA may be referred to as a cell pad extension 130_E. The cell pad extension 130_E may include a first portion 130P1 and a second portion 130P2. The first portion 130P1 may be disposed on the first active area AC1 and the device isolation layer 112, and the second portion 130P2 may be disposed on the buffer layer 118. Due to the thickness of the buffer layer 118, the second portion 130P2 may have the top surface disposed at a higher level than the top surface of the first portion 130P1.

An edge conductive layer BL_E may be disposed on the second portion 130P2 of the cell pad extension 130_E. The edge conductive layer BL_E may refer to or correspond to a portion of a bit line conductive layer 138 (refer to FIG. 16), which is for forming the bit line BL and remains after a process of patterning the bit line BL. However, in some example embodiments, a process for removing the edge conductive layer BL_E may be further performed. In this case, the edge conductive layer BL_E may be omitted.

In general or typically, the peripheral circuit gate electrode PGS is formed to have the same stack configuration as that of the bit line BL. For example, the peripheral circuit gate electrode PGS is formed, such that the bit line BL and a metal layer included in the peripheral circuit gate electrode PGS include the same material and/or have the same height. However, in a process for patterning the bit line BL, it becomes difficult to precisely control the patterning process due to a step or a level difference of the top surface of the cell pad extension 130_E disposed in the boundary area BA, and thus a process defect may occur.

However, according to some example embodiments, the cell pad structure 130 and the peripheral circuit gate electrode PGS may be formed to have the same stack configuration. Therefore, a process defect due to a step or a level difference of the top surface of the cell pad extension 130_E disposed in the boundary area BA may be prevented or reduced in likelihood of and/or impact from occurring. Alternatively or additionally, since a material included in the bit line BL may be selected independently from a material constituting the peripheral circuit gate electrode PGS, performance improvement or optimization of the semiconductor device 100 may be implemented.

Figure 7:
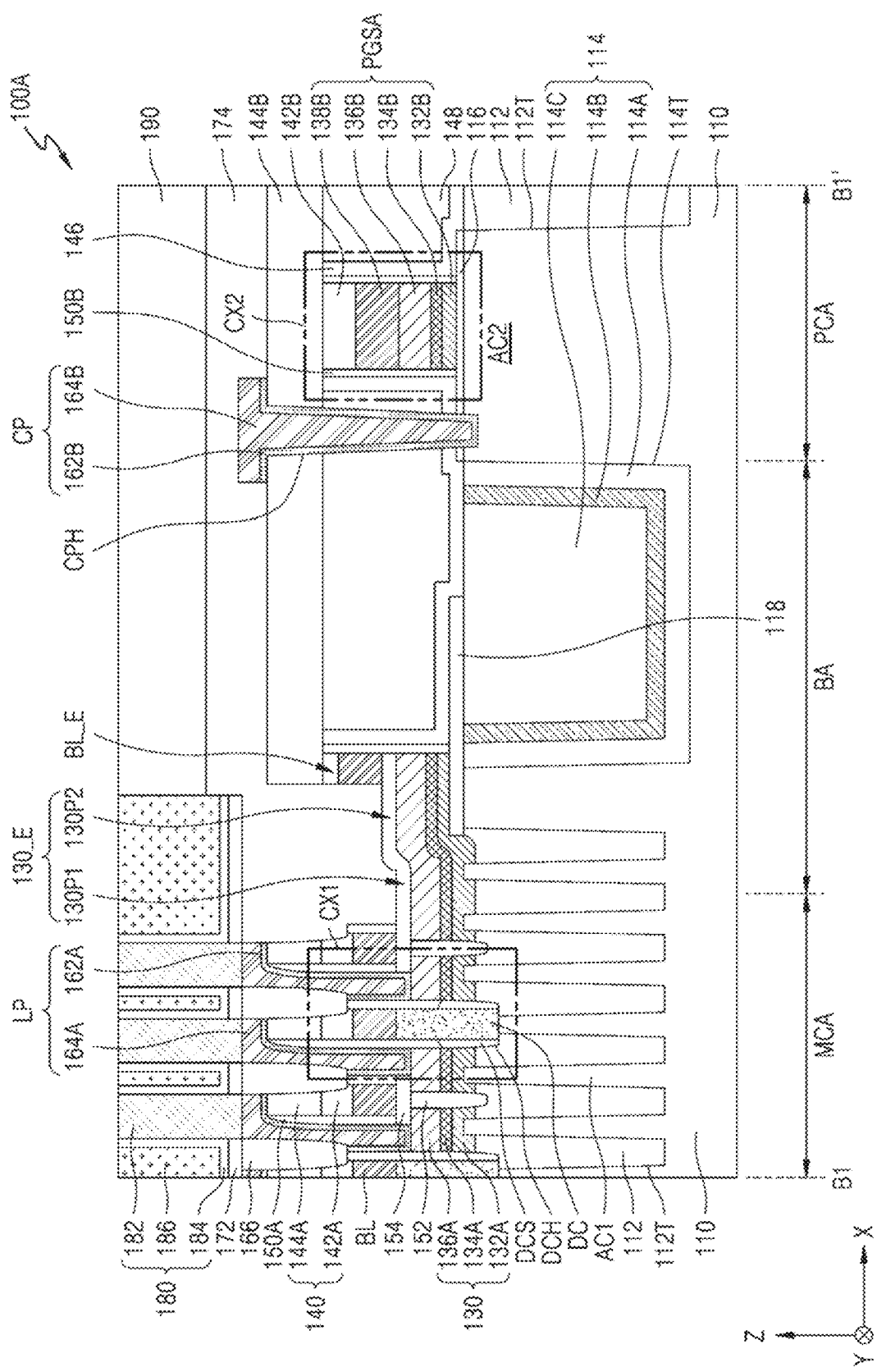
FIG. 7 is a cross-sectional view of a semiconductor device according to some example embodiments of inventive concepts.
Figure 8:
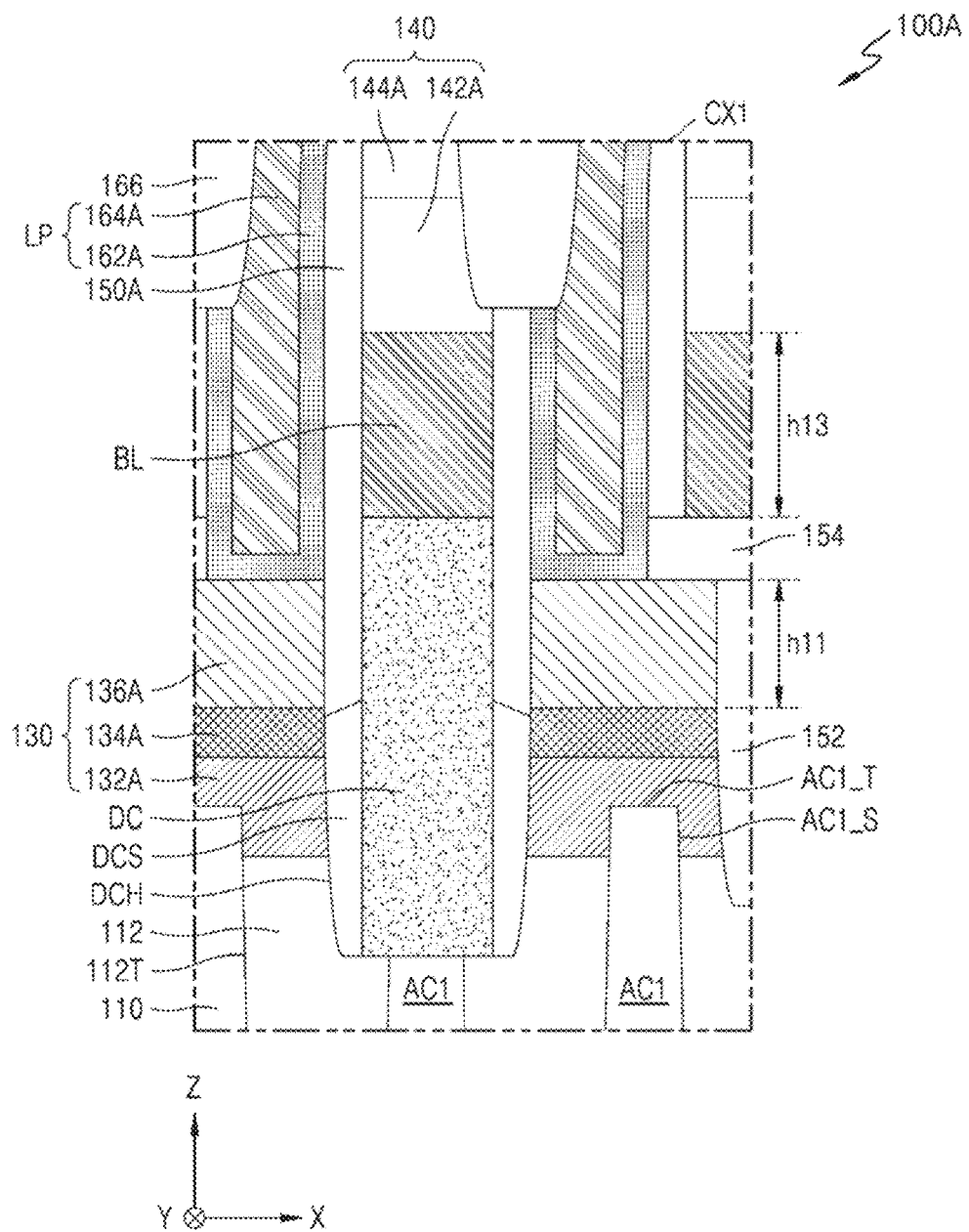
FIG. 8 is an enlarged cross-sectional view of a portion CX1 of FIG. 7.
Figure 9:
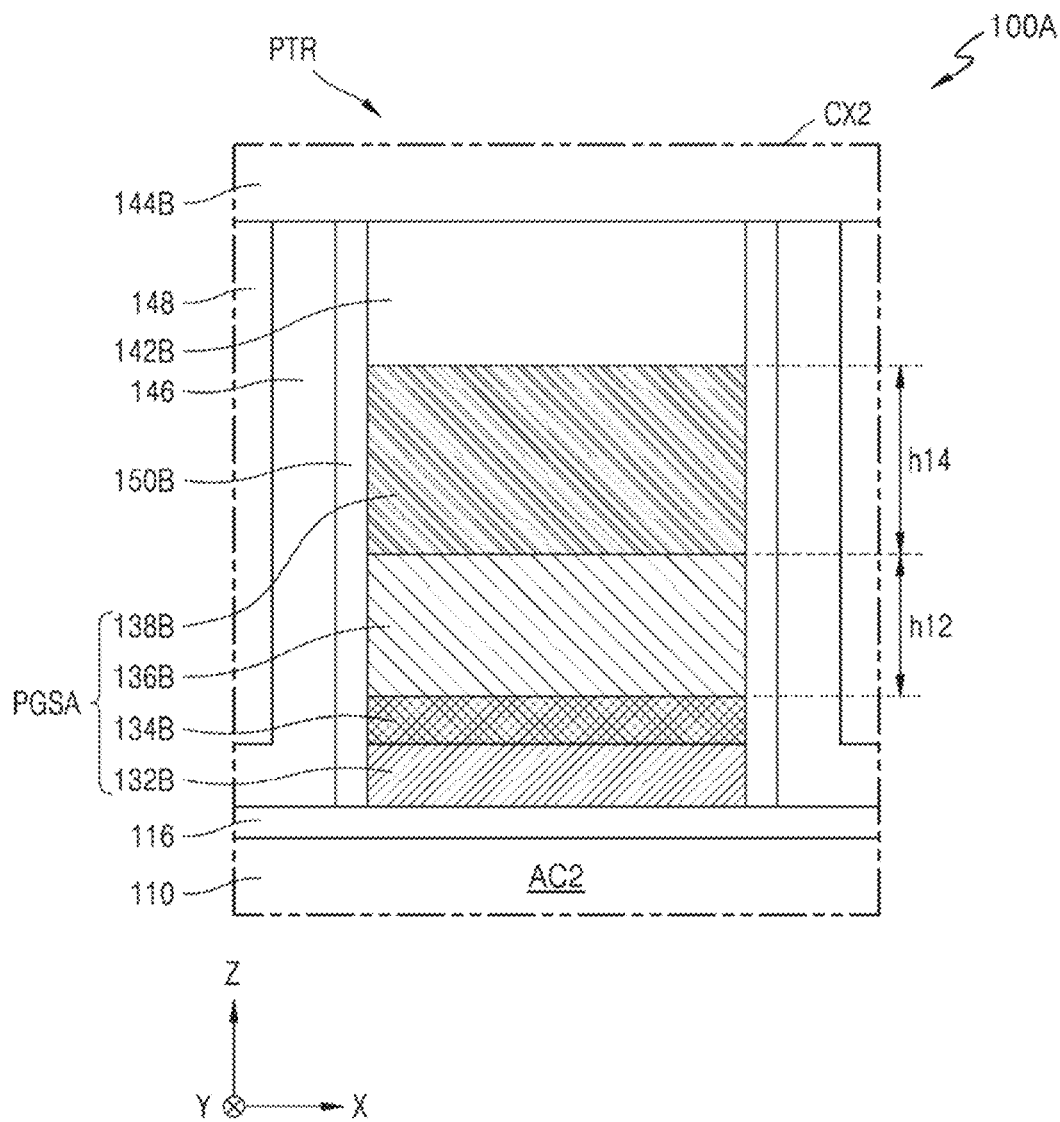
FIG. 9 is an enlarged cross-sectional view of a portion CX2 of FIG. 7.

FIG. 7 is a cross-sectional view of a semiconductor device 10A according to some example embodiments. FIG. 8 is an enlarged cross-sectional view of a portion CX1 of FIG. 7. FIG. 9 is an enlarged cross-sectional view of a portion CX2 of FIG. 7. In FIGS. 7 to 9, reference numerals same as those in FIGS. 1 to 6 denote the same elements.

Referring to FIGS. 7 to 9, a peripheral circuit gate electrode PGSA may include the second conductive layer 132B, the second intermediate layer 134B, the second metal layer 136B, and a third metal layer 138B that are sequentially stacked on the gate dielectric layer 116. The third metal layer 138B may include ruthenium (Ru), tungsten (W), cobalt (Co), titanium (Ti), titanium nitride (TiN), or a combination thereof.

In some example embodiments, the third metal layer 138B may include the same material as that of the bit line BL. For example, the third metal layer 138B and the bit line BL may be formed during the same process by using the same material, and thus a fourth height h14 of the third metal layer 138B may be substantially the same as the third height h13 of the bit line BL.

In some example embodiments, the second conductive layer 132B, the second intermediate layer 134B, and the second metal layer 136B of the peripheral circuit gate electrode PGSA is formed by using the same material as the first cell pad structure 130, and the third metal layer 138B of the peripheral circuit gate electrode PGSA is formed by using the same material as the bit line BL. Therefore, a process defect due to a step or a level difference of the top surface of the cell pad extension 130_E disposed in the boundary area BA may be prevented or reduced in likelihood of and/or impact from occurrence. Alternatively or additionally, since a material constituting the peripheral circuit gate electrode PGSA may be selected independently from a material included in the bit line BL, performance improvement or optimization of the semiconductor device 100A may be implemented.

FIGS. 10A to 21 are cross-sectional views showing a method of manufacturing the semiconductor device 100 according to some example embodiments. In detail, FIGS. 10A, 12 to 18, 19A, 20, and 21 are cross-sectional views corresponding to cross-sections taken along a line B1-B1' of FIG. 2, and FIGS. 10B, 11, and 19B are cross-sectional views corresponding to cross-sections taken along a line B2-B2' of FIG. 2. In FIGS. 10A to 21, reference numerals same as those in FIGS. 1 to 9 denote the same elements.

Figure 10A:
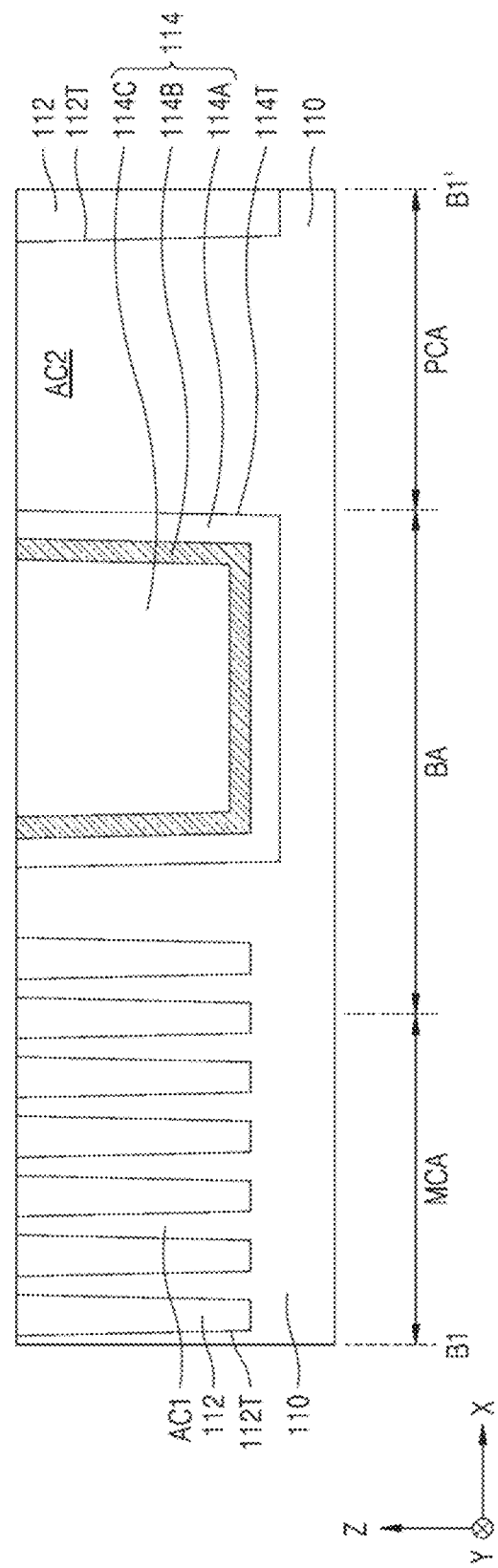
Figure 10B:
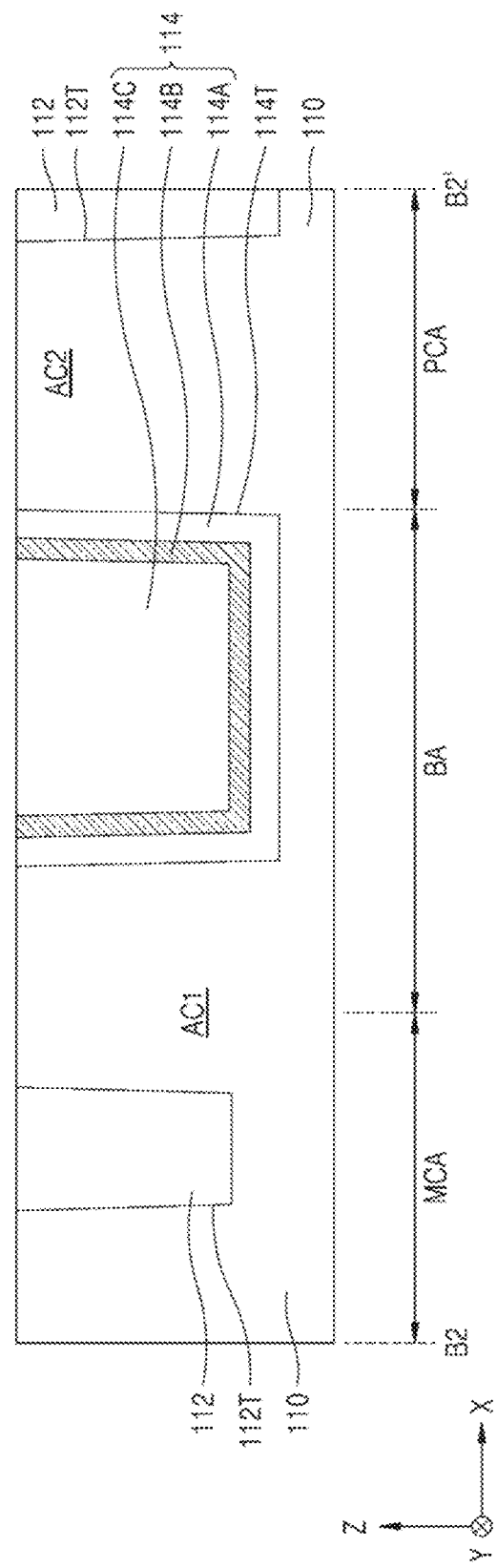

Referring to FIGS. 10A and 10B, a plurality of device isolation trenches 112T may be formed in the cell array area MCA and the peripheral circuit area PCA of the substrate 110, and the boundary trench 114T may be formed in the boundary area BA of the substrate 110.

Thereafter, the device isolation layer 112 filling the device isolation trenches 112T may be formed in the cell array area MCA and the peripheral circuit area PCA. As the device isolation layer 112 is formed, the first active areas AC1 are defined in the cell array area MCA of the substrate 110, and the second active area AC2 is defined in the peripheral circuit area PCA.

In some example embodiments, the device isolation layer 112 may be formed by using silicon oxide, silicon nitride, silicon oxynitride, or a combination thereof. In some example embodiments, the device isolation layer 112 may be formed as a double-layer structure including a silicon oxide layer and a silicon nitride layer, but inventive concepts are not limited thereto.

Thereafter, the buried insulation layer 114A, the insulation liner 114B, and the gap-fill insulation layer 114C are sequentially formed on the inner wall of the boundary trench 114T, and upper portions of the buried insulation layer 114A, the insulation liner 114B, and the gap-fill insulation layer 114C may be planarized, thereby forming the boundary structure 114.

In some example embodiments, the buried insulation layer 114A may be formed through one or more of an atomic layer deposition (ALD) process, a chemical vapor deposition (CVD) process, a plasma enhanced CVD (PECVD) process, a low pressure CVD (LPCVD) process, etc. In some example embodiments, the process for forming the buried insulation layer 114A may be performed at the same stage as at least some stages of the process for forming the device isolation layer 112, but inventive concepts are not limited thereto. In some example embodiments, the process for forming the buried insulation layer 114A may be separately performed after the process of forming the device isolation layer 112.

In some example embodiments, the insulation liner 114B may be formed by using silicon nitride through an ALD process, a CVD process, a PECVD process, an LPCVD process, etc. The gap-fill insulation layer 114C may be formed to fill the boundary trench 114T on the insulation liner 114B. The gap-fill insulation layer 114C may be formed to have a thickness sufficient to completely fill the remaining portion inside the boundary trench 114T.

In some example embodiments, the gap-fill insulation layer 114C may include a silicon oxide such as Tonen Silazene (TOSZ), undoped silicate glass (USG), boro-phospho-silicate glass (BPSG), phosphosilicate glass (PSG), flowable oxide (FOX), plasma enhanced deposition of tetraethyl-ortho-silicate (PE-TEOS), or fluoride silicate glass (FSG).

Figure 11:
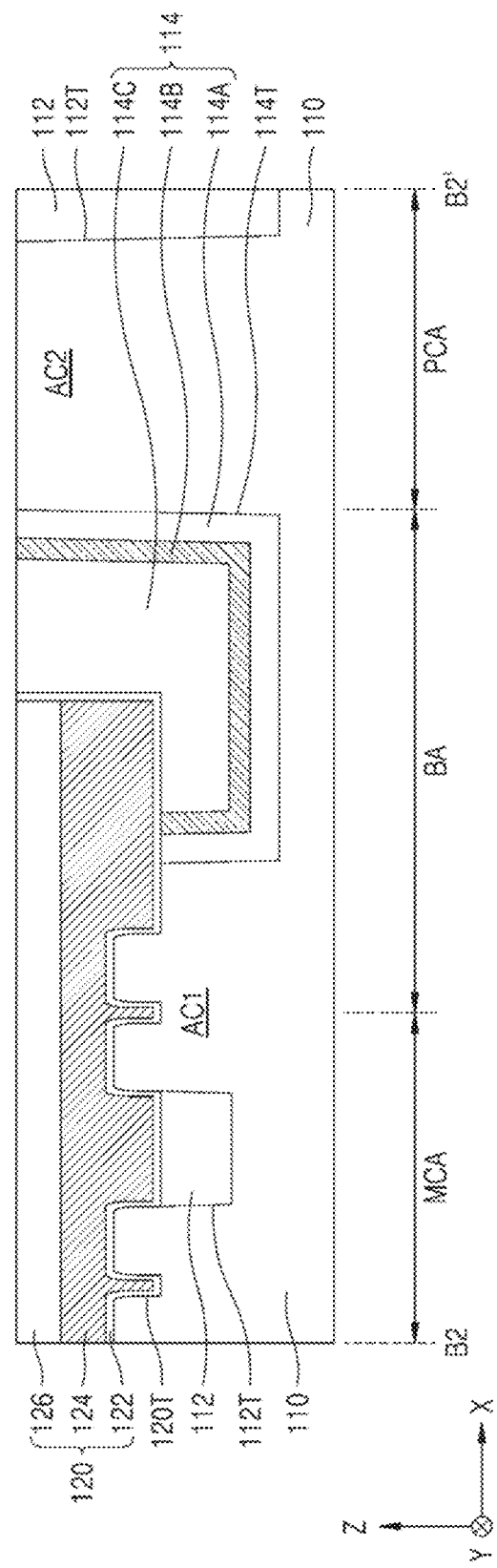

Referring to FIG. 11, a mask pattern (not shown) may be formed on the substrate 110, and a portion of the cell array area MCA of the substrate 110 may be removed by using the mask pattern as an etch mask, thereby forming the word line trench 120T.

The word line trench 120T may be disposed to extend from the cell array area MCA to a portion of the boundary area BA. For example, the mask pattern for forming the word line trench 120T may be formed by using a double patterning technique (DPT) or a quadruple patterning technique (QPT), but inventive concepts are not limited thereto.

Thereafter, the gate dielectric layer 122, the gate electrode 124, and the capping insulation layer 126 may be sequentially formed in the word line trench 120T.

For example, the gate dielectric layer 122 may be conformally disposed on the inner wall of the word line trench 120T. The gate electrode 124 may be formed by filling the word line trench 120T with a conductive layer (not shown) and then etching back the upper portion of the conductive layer to expose the upper portion of the word line trench 120T again. The capping insulation layer 126 may be formed by filling the remaining portion of the word line trench 120T with an insulation material and planarizing the insulation material until the top surface of the buried insulation layer 114A is exposed.

Figure 12:
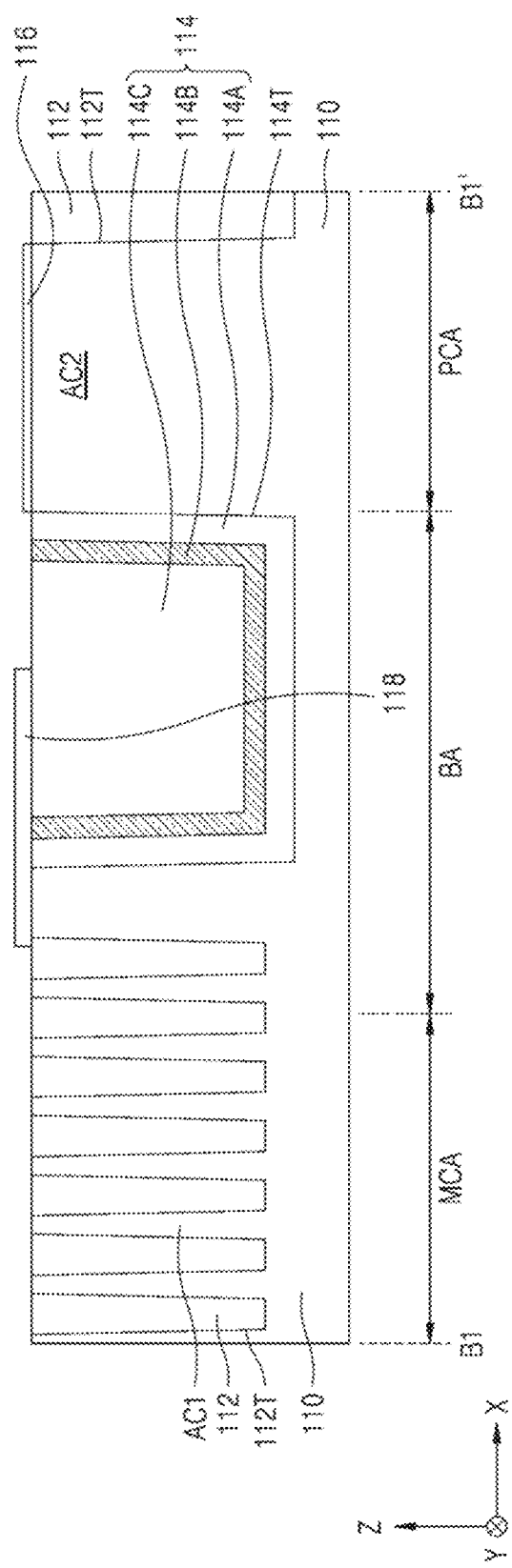

Referring to FIG. 12, the buffer layer 118 may be formed on the cell array area MCA and the boundary area BA. The buffer layer 118 may cover the top surface of the first active area AC1 in the cell array area MCA, and the top surface of the second active area AC2 may not be covered by the buffer layer 118 in the peripheral circuit area PCA.

Thereafter, the gate dielectric layer 116 may be formed on the substrate 110 in the peripheral circuit area PCA. The gate dielectric layer 116 may be formed through one or more of a thermal oxidation process, an ALD process, a CVD process, a PECVD process, an LPCVD process, etc.

Thereafter, a portion of the buffer layer 118 covering the cell array area MCA may be removed, thereby leaving the buffer layer 118 on the boundary area BA. The buffer layer 118 may cover the first active area AC1 and the top surface of the device isolation layer 112 in edge areas of the cell array area MCA and may extend onto the boundary structure 114.

In some example embodiments, a recess process may be performed on the top surface of the device isolation layer 112 exposed in the cell array area MCA, such that the top surface of the first active area AC1 is located at a higher level than the top surface of the device isolation layer 112 and a portion of the sidewall of the first active area AC1 is exposed. However, inventive concepts are not limited thereto.

Figure 13:
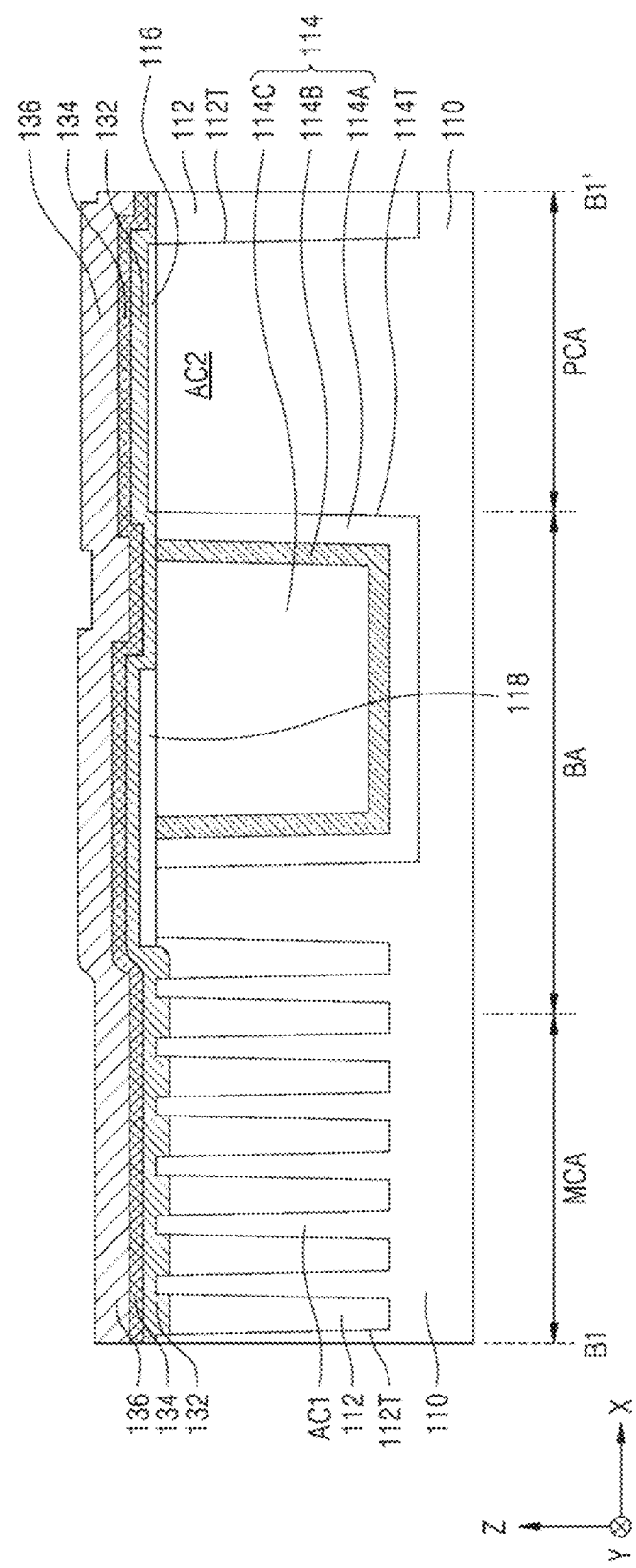

Referring to FIG. 13, a conductive layer 132 may be formed on the buffer layer 118 in the cell array area MCA and on the gate dielectric layer 116 and the device isolation layer 112 in the peripheral circuit area PCA. In some example embodiments, the conductive layer 132 may include Si, Ge, W, WN, Co, Ni, Al, Mo, Ru, Ti, TiN, Ta, TaN, Cu, or a combination thereof. For example, the conductive layer 132 may include polysilicon such as doped polysilicon.

Thereafter, an intermediate layer 134 may be formed on the conductive layer 132, and a metal layer 136 may be formed on the intermediate layer 134. The intermediate layer 134 and the metal layer 136 may be formed on the entire areas of the cell array area MCA and the peripheral circuit area PCA. In some example embodiments, the intermediate layer 134 and the metal layer 136 may include TiN, TiSiN. W, tungsten silicide, or a combination thereof.

Figure 14:
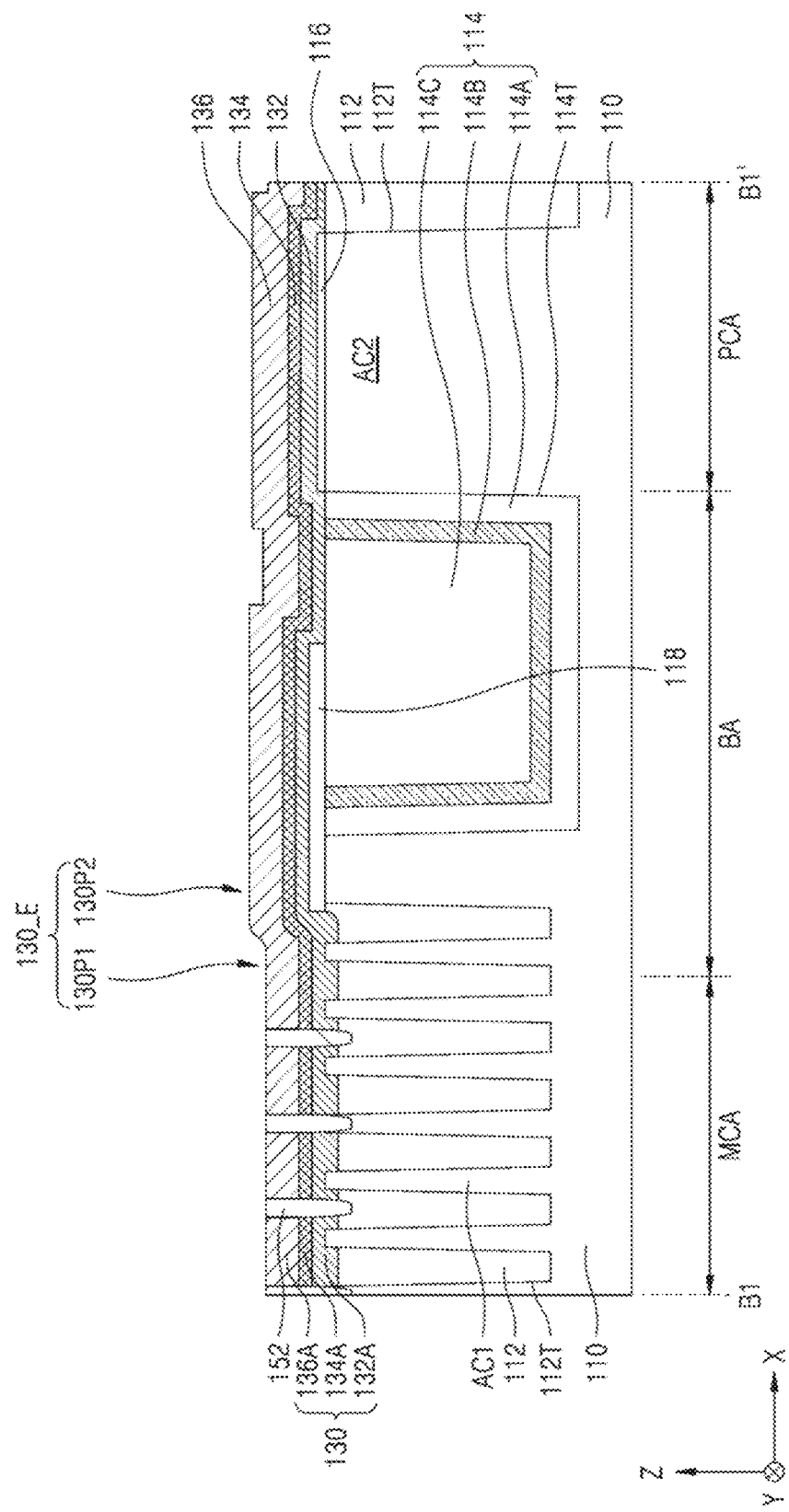

Referring to FIG. 14, a mask pattern (not shown) may be formed on the metal layer 136, and the metal layer 136, the intermediate layer 134, and the conductive layer may be patterned in the cell array area MCA by using the mask pattern as an etching mask, thereby forming the cell pad structures 130.

In some example embodiments, the cell pad structures 130 may have a regular grid arrangement and/or matrix arrangement in which the cell pad structures 130 are arranged to be spaced apart from one another in the first horizontal direction X and the second horizontal direction Y. The metal layer 136 may remain on the peripheral circuit area PCA.

The outermost cell pad structure 130 from among the cell pad structures 130 may extend onto the boundary area BA. The cell pad structure 130 disposed on the boundary area BA may be referred to as a cell pad extension 130_E. The cell pad extension 130_E may include a first portion 130P1 and a second portion 130P2. The first portion 130P1 may be disposed on the first active area AC1 and the device isolation layer 112, and the second portion 130P2 may be disposed on the buffer layer 118. Due to the thickness of the buffer layer 118, the second portion 130P2 may have the top surface disposed at a higher level than the top surface of the first portion 130P1.

Thereafter, the insulation pattern 152 surrounding the sidewalls of the cell pad structures 130 may be formed. The insulation pattern 152 may be formed by using silicon nitride.

Figure 15:
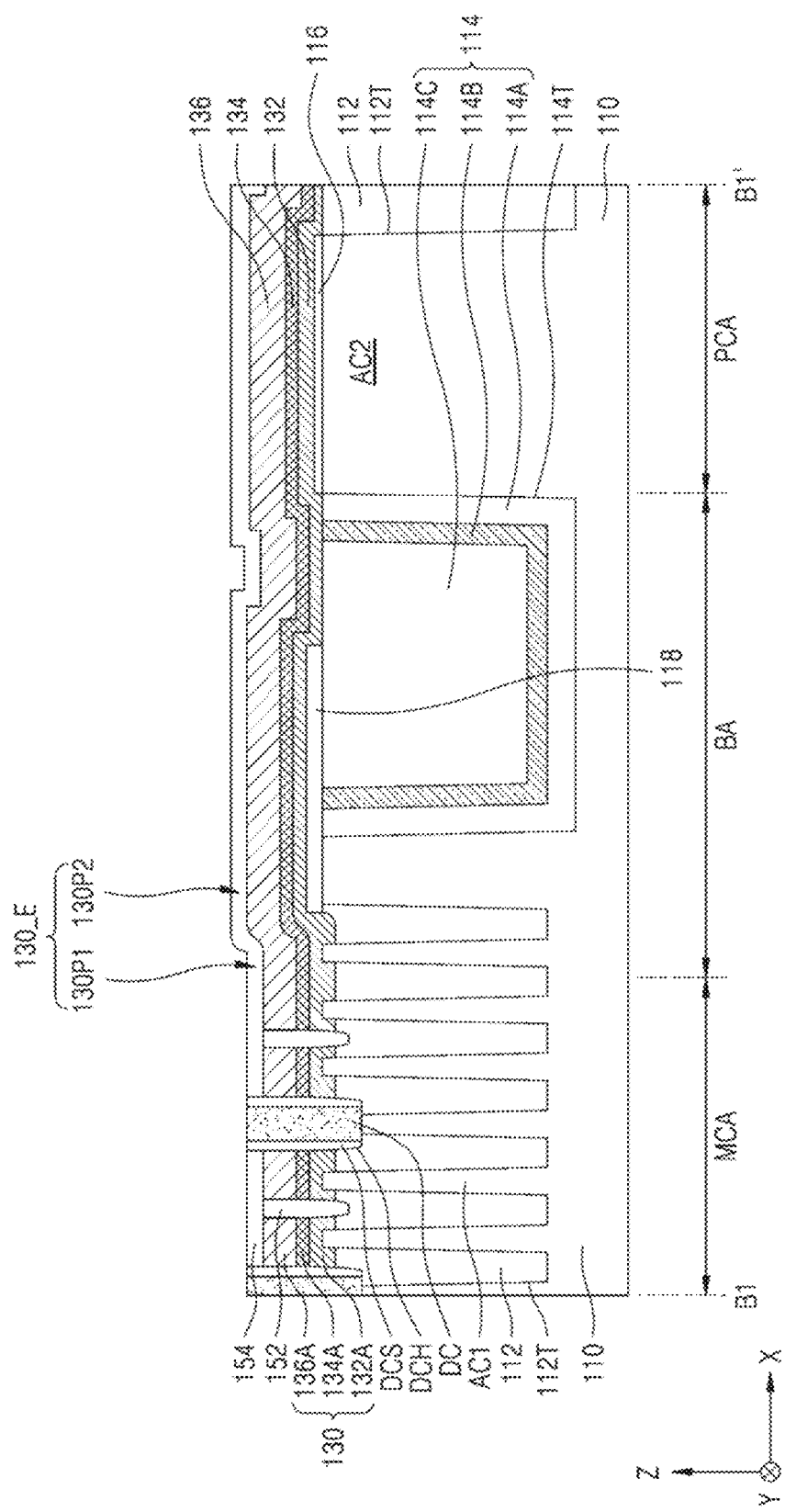

Referring to FIG. 15, the insulation layer 154 may be formed on the cell pad structures 130, the top surface of the insulation pattern 152, and on the metal layer 136. The insulation layer 154 may be formed by using silicon nitride.

Thereafter, a mask pattern (not shown) may be formed on the insulation layer 154, and some of the cell pad structures 130 may be removed to re-expose the first active area AC1 of the substrate 110. Thereafter, the upper portion of the exposed substrate 110 may be further removed, thereby forming a direct contact hole DCH.

Thereafter, the direct contact spacer DCS may be formed on the inner wall of the direct contact hole DCH. For example, the direct contact spacer DCS may be formed by using silicon nitride or silicon oxide.

A conductive layer (not shown) may be formed inside the direct contact hole DCH, and the upper portion of the conductive layer may be etched back until the top surface of the insulation layer 154 is exposed, thereby forming the direct contact DC inside the direct contact hole DCH.

Figure 16:
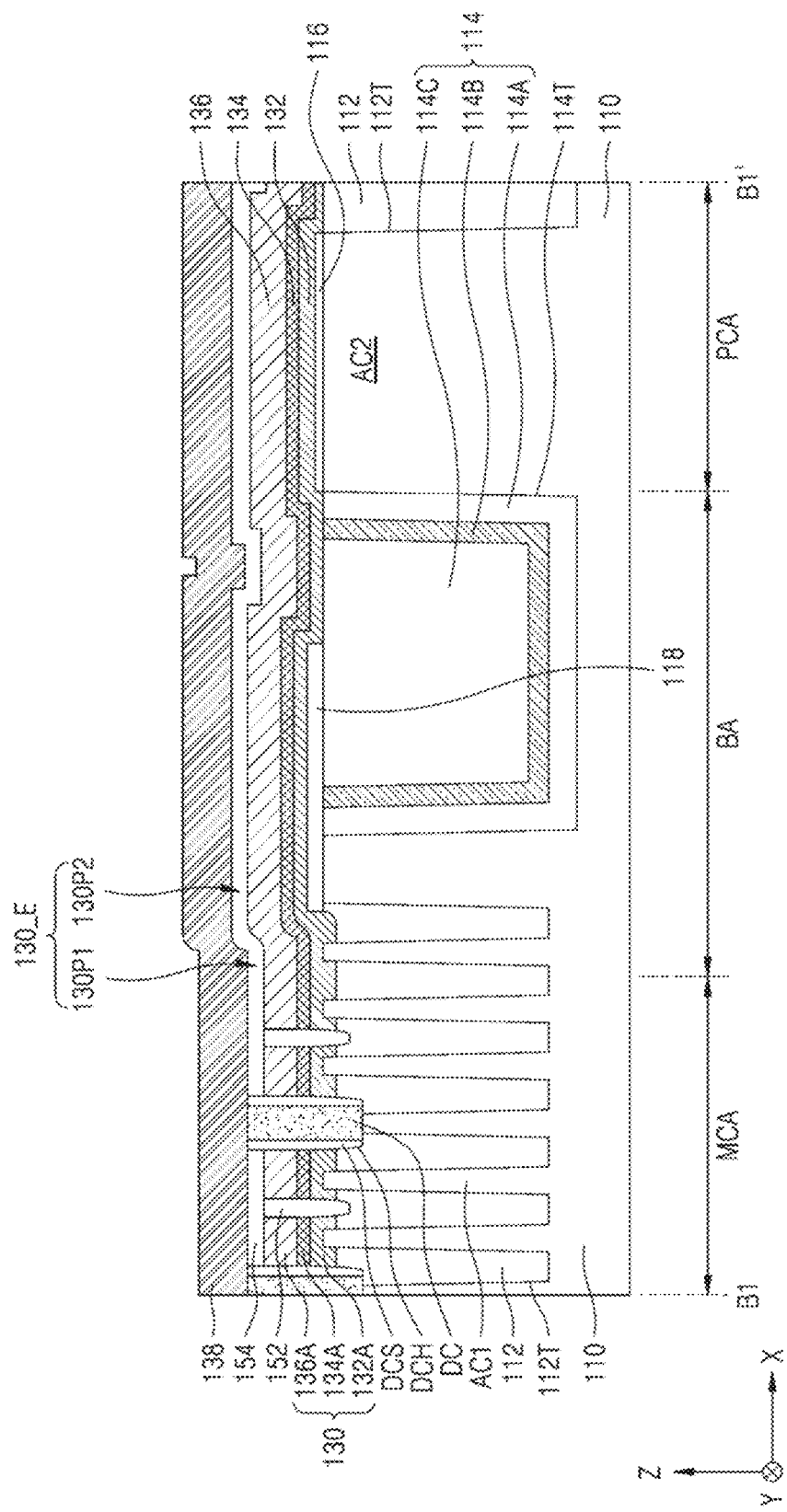

Referring to FIG. 16, the bit line conductive layer 138 covering the direct contact DC and the insulation layer 154 may be formed. The bit line conductive layer 138 may include at least one of ruthenium (Ru), tungsten (W), cobalt (Co), titanium (Ti), and titanium nitride (TiN).

In some example embodiments, the bit line conductive layer 138 may be formed by using a material different from a material included in the metal layer 136. However, inventive concepts are not limited thereto, and the bit line conductive layer 138 may be formed by using the same material as the material included in the metal layer 136.

Figure 17:
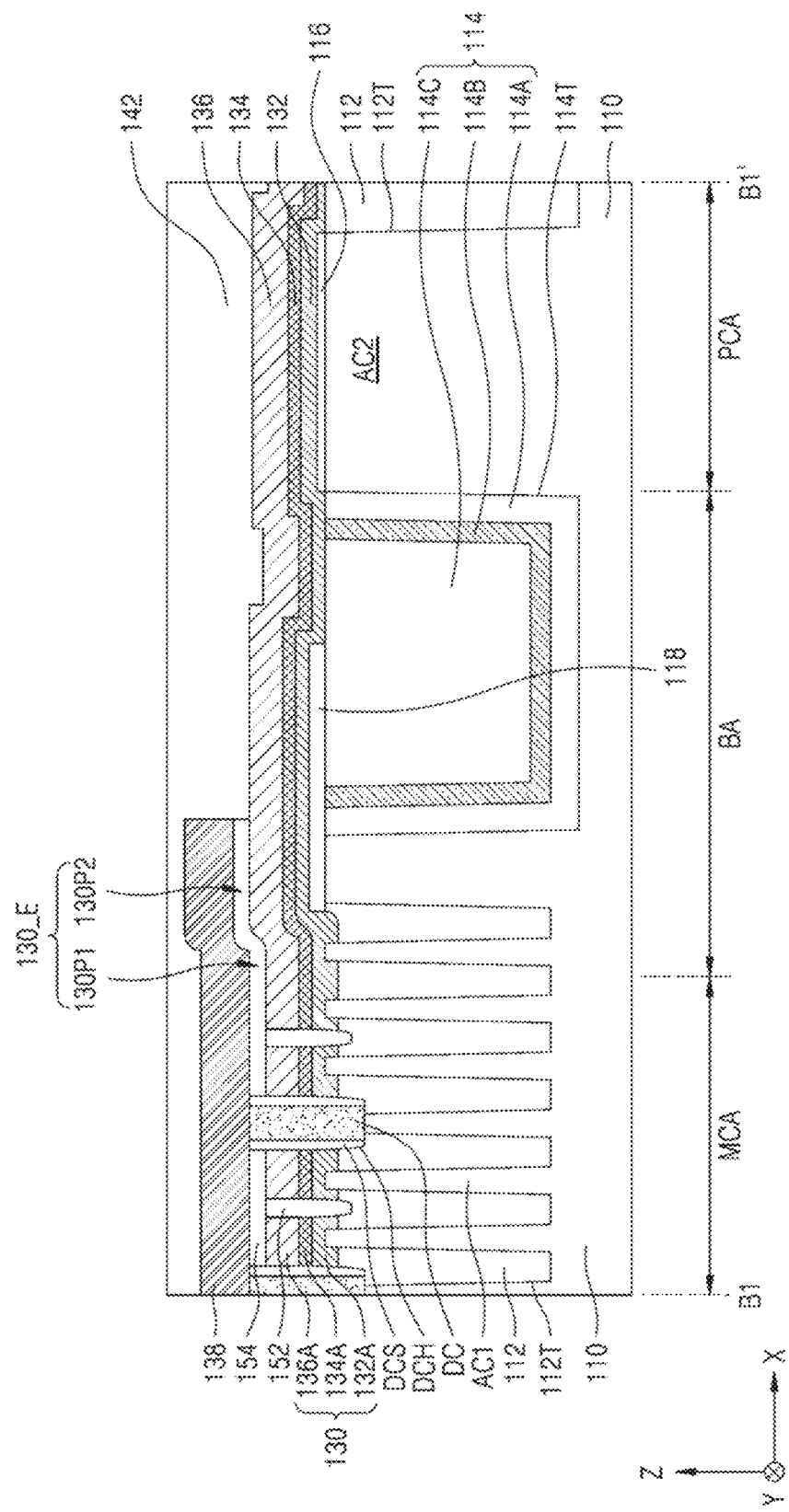

Referring to FIG. 17, the insulation layer 154 and the bit line conductive layer 138 may be removed from the peripheral circuit area PCA and the boundary area BA.

Thereafter, a first insulation capping layer 142 may be formed on the metal layer 136 in the peripheral circuit area PCA and on the bit line conductive layer 138 in the cell array area MCA.

Figure 18:
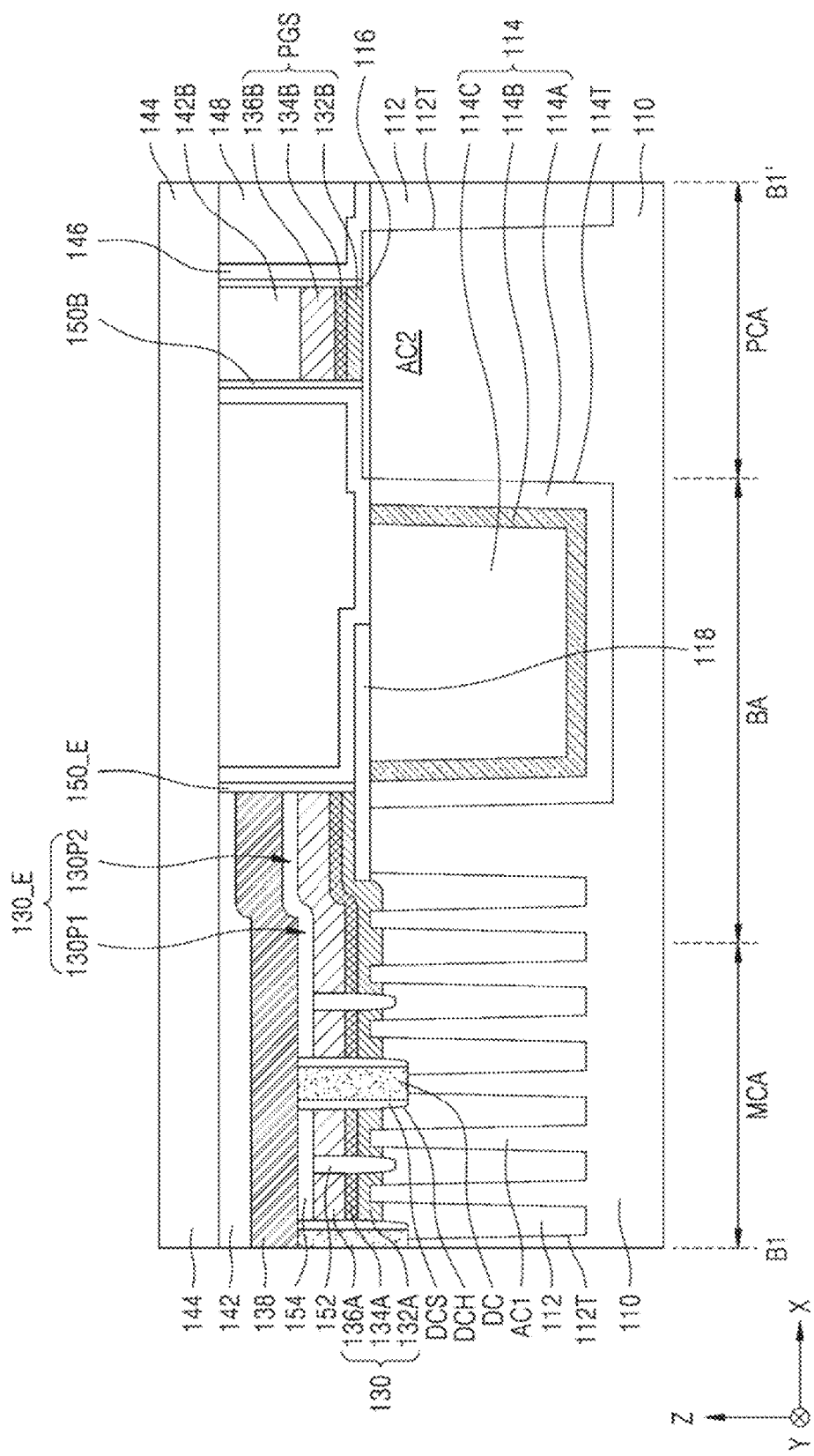

Referring to FIG. 18, a mask pattern (not shown) may be formed on the first insulation capping layer 142, and the first insulation capping layer 142, the metal layer 136, the intermediate layer 134, and the conductive layer 132 may be patterned in the peripheral circuit area PCA by using the mask pattern, thereby forming the gate capping pattern 142B and the peripheral circuit gate electrode PGS.

In some example embodiments, the peripheral circuit gate electrode PGS may include the second conductive layer 132B, the second intermediate layer 134B, and the second metal layer 136B sequentially arranged on the gate dielectric layer 116.

Thereafter, an insulation spacer 150B covering the sidewall of the peripheral circuit gate electrode PGS may be formed. The insulation spacer 150B may be formed by using silicon nitride.

In the process of forming the insulation spacer 150B, a spacer 150_E may also be disposed on the sidewall of the cell pad extension 130_E disposed in the boundary area BA.

Thereafter, a passivation layer 146 covering the gate capping pattern 142B and sidewalls of the peripheral circuit gate electrode PGS is formed in the peripheral circuit area PCA. An insulation layer (not shown) may be formed on the passivation layer 146 to completely cover the gate capping pattern 142B and the peripheral circuit gate electrode PGS, and the upper portion of the insulation layer may be planarized until the top surface of the gate capping pattern 142B is exposed, thereby forming the first interlayer insulation layer 148.

Figure 19A:
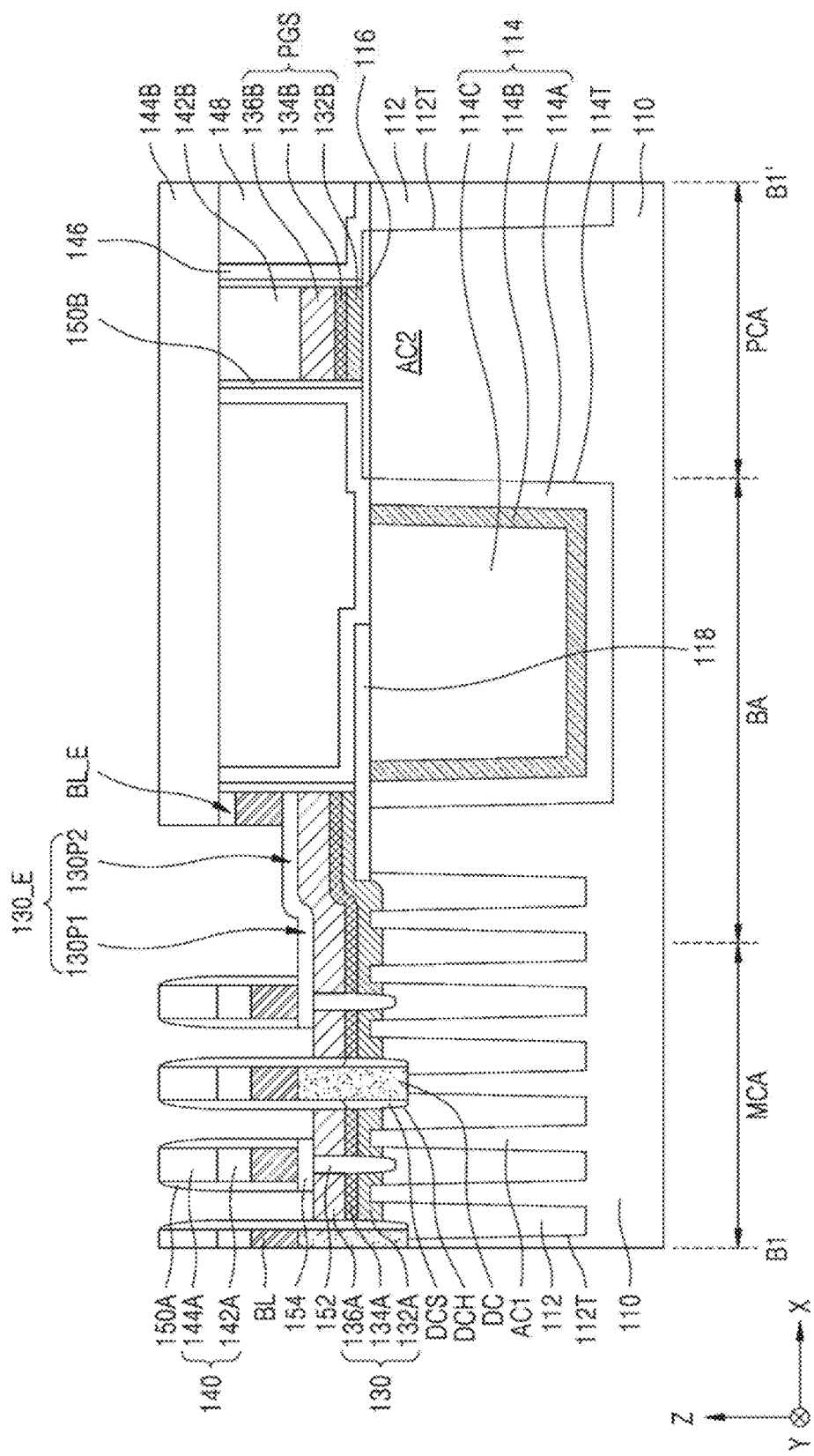
Figure 19B:
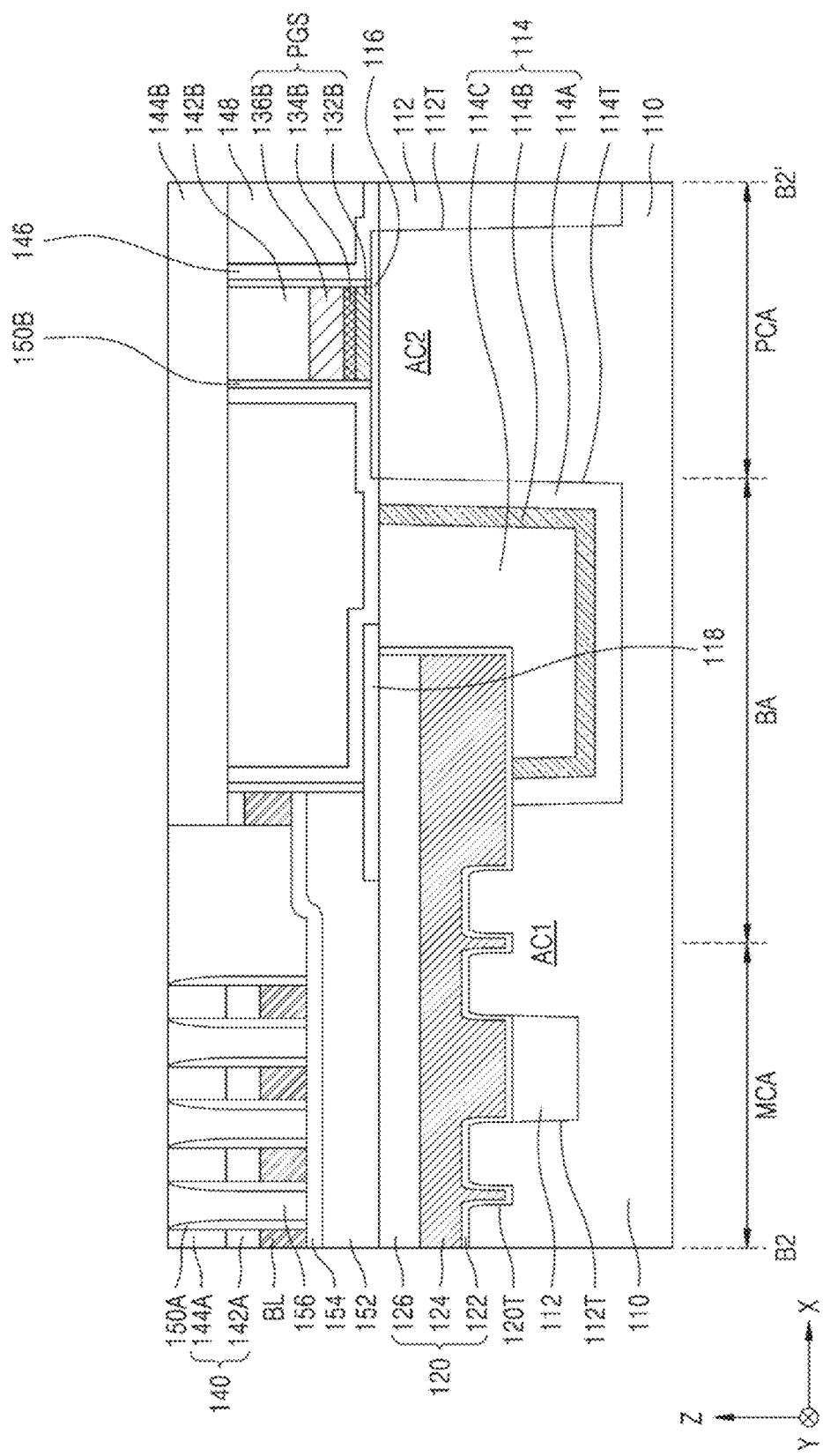

Referring to FIGS. 19A and 19B, a second insulation capping layer 144 may be formed on the first insulation capping layer 142 in the cell array area MCA and on the first interlayer insulation layer 148 in the peripheral circuit area PCA.

Thereafter, the second insulation capping layer 144, the first insulation capping layer 142, and the bit line conductive layer 138 may be patterned in the cell array area MCA, thereby forming the insulation capping structures 140 and the bit lines BL.

In the process of forming the bit line BL, an upper portion of the direct contact spacer DCS disposed inside the direct contact hole DCH may be removed at the same time, and thus the top surface of the direct contact spacer DCS may be located at a level lower than that of the top surface of the direct contact DC.

In the process of forming the bit line BL, a portion of the bit line conductive layer 138 may remain on the boundary area BA, and the portion may be referred to as the edge conductive layer BL_E.

Thereafter, the bit line spacer 150A may be formed on the sidewall of a bit line structure BLS, and the insulation fences 156 may be formed between the bit lines BL.

Figure 20:
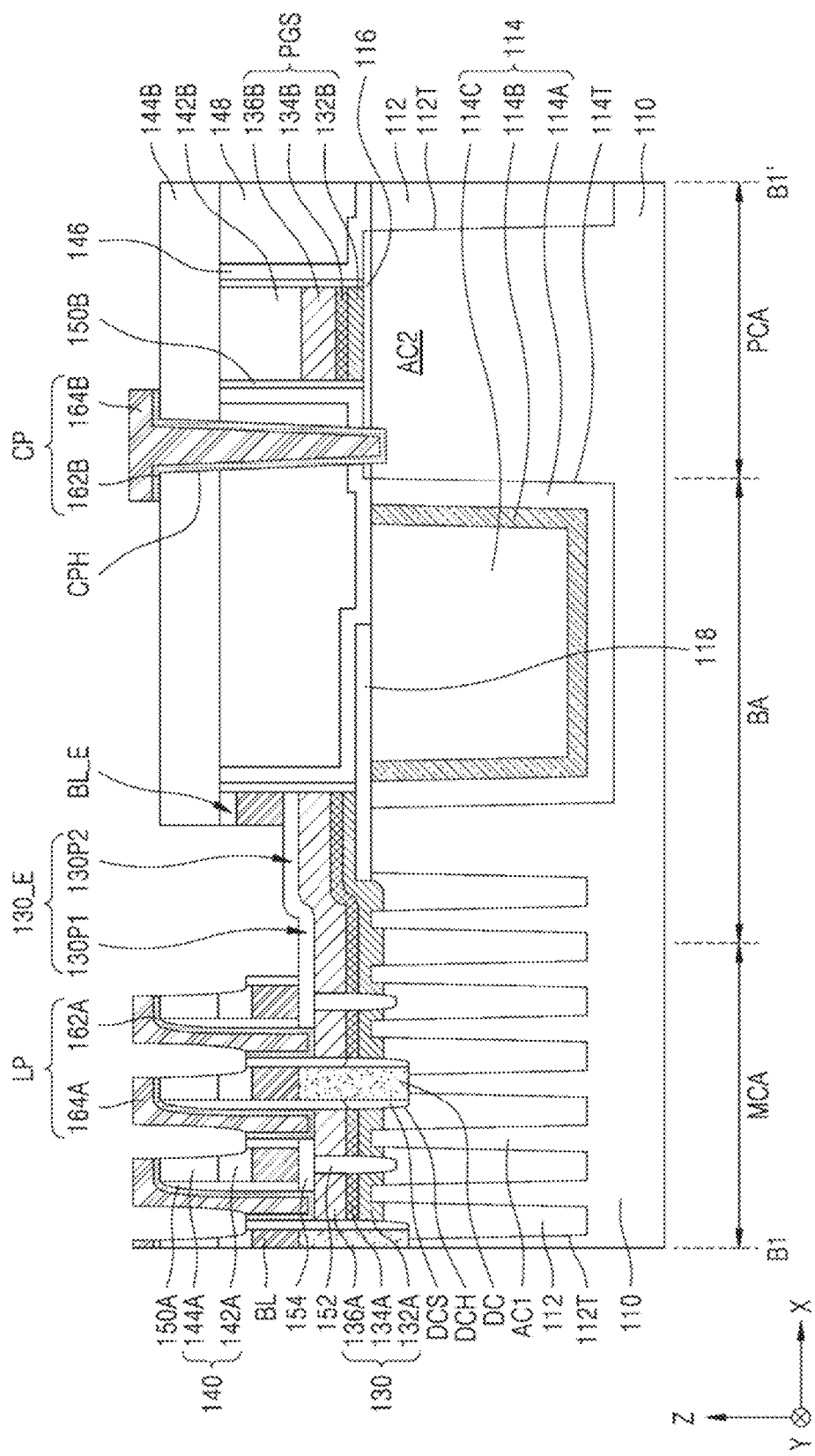

Referring to FIG. 20, the second insulation capping layer 144 and the first interlayer insulation layer 148 are etched in the peripheral circuit area PCA, thereby forming a plurality of contact holes CPH exposing the second active areas AC2 of the substrate 110. Thereafter, the insulation layer 154 exposed between the bit lines BL is removed in the cell array area MCA, thereby exposing the top surface of the cell pad structure 130.

Thereafter, a conductive barrier film 162 and a conductive layer 164 covering the exposed surface of the substrate 110 in the cell array area MCA and the peripheral circuit area PCA are formed. By patterning the conductive barrier film 162 and the conductive layer 164, the landing pads LP including the conductive barrier film 162A and the landing pad conductive layer 164A are formed in the cell array area MCA, and a plurality of contact plugs CP including the conductive barrier film 162B and the landing pad conductive layer 164B are formed in the peripheral circuit area PCA.

Figure 21:
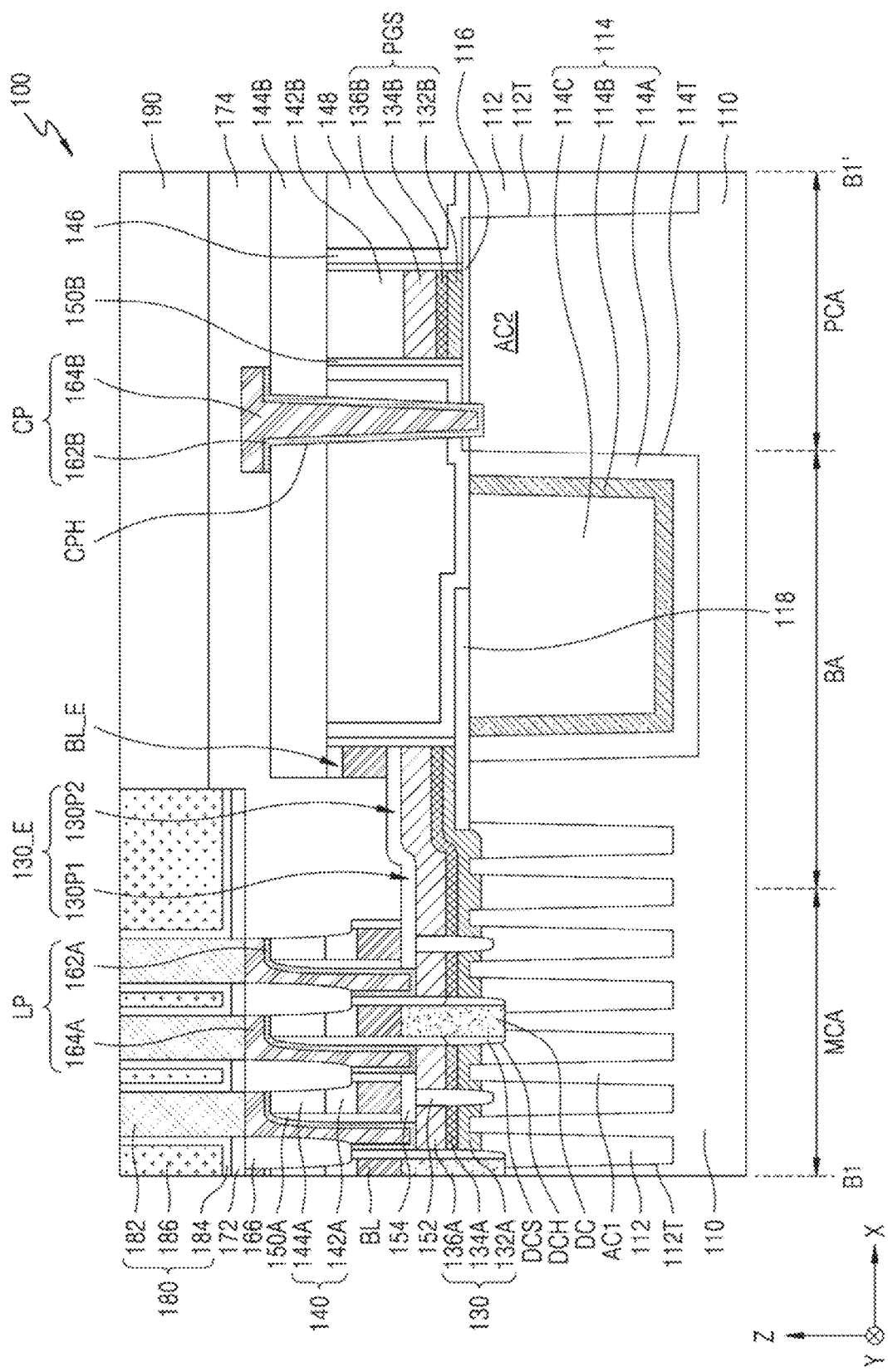

Referring now to FIG. 21, the insulation pattern 166 covering the landing pads LP may be formed in the cell array area MCA, and the second etch stop layer 174 covering the contact plugs CP may be formed in the peripheral circuit area PCA.

Thereafter, the first etch stop layer 172 may be formed on the cell array area MCA.

The lower electrodes 182, which penetrate through the first etch stop layer 172 and are connected to the landing pads LP, may be formed, and the capacitor dielectric layer 184 and the upper electrode 186 may be sequentially formed on the sidewalls of the lower electrodes 182.

Thereafter, the second interlayer insulation layer 190 covering the upper electrode 186 may be formed on the cell array area MCA and the peripheral circuit area PCA.

The semiconductor device 100 may be completed by performing the above-described method.

In general or typically, the peripheral circuit gate electrode PGS is formed to have the same stack configuration as that of the bit line BL. For example, the peripheral circuit gate electrode PGS is formed, such that the bit line BL and a metal layer included in the peripheral circuit gate electrode PGS include the same material and/or have the same height. However, in a process for patterning the bit line BL, it becomes difficult to precisely control a patterning process due to a step or a level difference of the top surface of the cell pad extension 130_E disposed in the boundary area BA, and thus a process defect may occur.

However, according to some example embodiments, the cell pad structure 130 and the peripheral circuit gate electrode PGS may be formed to have the same stack configuration. Therefore, a process defect due to a step or a level difference of the top surface of the cell pad extension 130_E disposed in the boundary area BA may be prevented or reduced in likelihood of and/or impact from occurrence. Alternatively or additionally, since a material included in the bit line BL may be selected independently from a material constituting the peripheral circuit gate electrode PGS, performance improvement and/or flexibility and/or optimization of the semiconductor device 100 may be implemented.

In other embodiments, in the process described with reference to FIG. 15, the insulation layer 154 formed on the peripheral circuit area PCA may be removed, and then the bit line conductive layer 138 may be formed directly on the metal layer 136. In this case, the semiconductor device 100A described with reference to FIGS. 7 to 9 may be formed.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

While inventive concepts have been particularly shown and described with reference to embodiments thereof, it will be understood that various changes in form and details may be made therein without departing from the spirit and scope of the following claims. Furthermore example embodiments are not necessarily mutually exclusive. For example, some example embodiments may include one or more features described with reference to one or more figures, and may also include one or more other features described with reference to one or more other figures.

What is claimed is:
1. A semiconductor device comprising:
a substrate comprising a cell array area, a peripheral circuit area, a plurality of first active areas defined in the cell array area, and at least one second active area defined in the peripheral circuit area;
a plurality of bit lines in the cell array area of the substrate and extending in a first direction;
a plurality of cell pad structures between the plurality of bit lines and each comprising a first conductive layer, a first intermediate layer, and a first metal layer that are sequentially arranged on a top surface of a respective one of the plurality of first active areas; and
a peripheral circuit gate electrode on the peripheral circuit area of the substrate and comprising a second conduc- tive layer, a second intermediate layer, and a second metal layer that are sequentially arranged on the at least one second active area.

2. The semiconductor device of claim 1,
wherein the first conductive layer comprises a same first material as the material included in the second conductive layer,
the first intermediate layer comprises a same second material as the material included in the second intermediate layer, and
the first metal layer comprises a same third material as the material included in the second metal layer.

3. The semiconductor device of claim 1, wherein the first conductive layer covers a top surface and side surfaces of each of the first active areas.

4. The semiconductor device of claim 1, further comprising:
a bit line contact between the bit lines and the first active areas;
a bit line contact spacer between the bit line contact and a respective one of the plurality of cell pad structures; and
bit line spacers on sidewalls of the plurality of bit lines.

5. The semiconductor device of claim 4,
wherein the bit line contact comprises a metal material, and
the bit line contact contacts top surfaces of the first active areas.

6. The semiconductor device of claim 4,
wherein sidewalls of the first conductive layer of the plurality of cell pad structures contact the bit line contact spacer, and
sidewalls of the first metal layer of the plurality of cell pad structures contact the bit line spacers.

7. The semiconductor device of claim 1,
wherein the substrate further comprises a boundary area between the cell array area and the peripheral circuit area, and
the semiconductor device further comprises: a boundary structure in a boundary trench extending into the boundary area, the boundary structure comprising an insulation material; and
a buffer layer on the boundary structure.

8. The semiconductor device of claim 7, wherein at least one of the cell pad structures extends onto the boundary structure.

9. The semiconductor device of claim 8, wherein the at least one of the cell pad structures comprises a first portion and a second portion, the first portion is on the first active areas, and the second portion is on the buffer layer.

10. The semiconductor device of claim 1,
wherein the first metal layer has a first height in a vertical direction,
the second metal layer has a second height in the vertical direction, and
the second height is same as the first height.

11. The semiconductor device of claim 10,
wherein the bit lines have a third height in the vertical direction, and
the third height is different from the first height and is different from the second height.

12. The semiconductor device of claim 1,
wherein the peripheral circuit gate electrode further comprises a third metal layer disposed on the second metal layer, and
the third metal layer comprises a same material as the material included in the bit lines.

13. The semiconductor device of claim 12,
wherein the bit lines have a third height in a vertical direction, the third metal layer has a fourth height in the vertical direction, and
the fourth height is same as the third height.

14. A semiconductor device comprising:
a substrate comprising a cell array area, a boundary area, a peripheral circuit area, a plurality of first active areas defined in the cell array area, and at least one second active area defined in the peripheral circuit area;
a plurality of bit lines in the cell array area of the substrate and extending in a first direction;
a plurality of cell pad structures arranged between two adjacent bit lines from among the plurality of bit lines and each comprising a first conductive layer and a first metal layer that are sequentially arranged on a top surface of a respective one of the plurality of the first active area; and
a peripheral circuit gate electrode on the peripheral circuit area of the substrate and comprising a second conductive layer and a second metal layer that are sequentially arranged on the at least one second active area,
wherein a first height of the cell pad structures is same as a second height of the peripheral circuit gate electrode.

15. The semiconductor device of claim 14, further comprising:
a bit line contact disposed between the bit lines and the first active areas;
a bit line contact spacer disposed between the bit line contact and a respective one of the plurality of cell pad structures; and
bit line spacers arranged on sidewalls of the bit lines.

16. The semiconductor device of claim 15,
wherein sidewalls of the first conductive layer of the plurality of cell pad structures contact the bit line contact spacer, and
sidewalls of the first metal layer of the cell pad structure contact the bit line spacers.

17. The semiconductor device of claim 14,
wherein the first conductive layer comprises a same first material as the material included in the second conductive layer, and
the first metal layer comprises a same second material as the material included in the second metal layer.

18. The semiconductor device of claim 14, further comprising:
a boundary structure in a boundary trench extending into the boundary area, the boundary structure comprising an insulation material; and
a buffer layer on the boundary structure,
wherein at least one of the cell pad structures extends onto the boundary structure.

19. The semiconductor device of claim 14,
wherein the first metal layer has a first height in a vertical direction,
the second metal layer has a second height in the vertical direction, and
the second height is same as the first height.

20. A semiconductor device comprising:
a substrate comprising a cell array area, a boundary area, a peripheral circuit area, a plurality of first active areas defined in the cell array area, and at least one second active area defined in the peripheral circuit area;
a plurality of bit lines in the cell array area of the substrate and extending in a first direction;

a bit line contact disposed between the bit lines and the first active areas and electrically connecting the bit lines to the first active areas;

a bit line contact spacer surrounding sidewalls of the bit line contact;

a plurality of cell pad structures between two adjacent bit lines from among the plurality of bit lines and each comprising a first conductive layer, a first intermediate layer, and a first metal layer that are sequentially arranged on a top surface of a respective one of the plurality of first active areas;

a plurality of landing pads respectively arranged on the cell pad structures; and a peripheral circuit gate electrode on the peripheral circuit area of the substrate and comprising a second conductive layer, a second intermediate layer, and a second metal layer that are sequentially arranged on the at least one second active area, wherein the second metal layer comprises a same material as the material included in the first metal layer.

\* \* \* \* \*